(12) United States Patent
Mohanty

(10) Patent No.: US 11,226,446 B2
(45) Date of Patent: Jan. 18, 2022

(54) HYDROGEN/NITROGEN DOPING AND CHEMICALLY ASSISTED ETCHING OF HIGH REFRACTIVE INDEX GRATINGS

(71) Applicant: Facebook Technologies, LLC, Menlo Park, CA (US)

(72) Inventor: Nihar Ranjan Mohanty, Snoqualmie, WA (US)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 16/867,902

(22) Filed: May 6, 2020

(65) Prior Publication Data
US 2021/0349252 A1 Nov. 11, 2021

(51) Int. Cl.
| | |
|---|---|
| *G02B 27/01* | (2006.01) |
| *F21V 8/00* | (2006.01) |
| *C23F 4/00* | (2006.01) |

(52) U.S. Cl.
CPC .............. *G02B 6/0065* (2013.01); *C23F 4/00* (2013.01); *G02B 6/0016* (2013.01); *G02B 6/0038* (2013.01); *G02B 27/0172* (2013.01); *G02B 2027/0178* (2013.01)

(58) Field of Classification Search
CPC .. G02B 6/0065; G02B 6/0016; G02B 6/0038; G02B 27/0172; G02B 2027/0178; C23F 4/00
See application file for complete search history.

(56) References Cited

U.S. PATENT DOCUMENTS

| | | | |
|---|---|---|---|
| 4,595,484 A | 6/1986 | Giammarco et al. | |
| 4,956,314 A | 9/1990 | Tam et al. | |
| 5,668,026 A * | 9/1997 | Lin | ................... H01L 21/26586 257/E21.345 |
| 5,712,188 A | 1/1998 | Chu et al. | |
| 5,770,120 A | 6/1998 | Kamihara et al. | |
| 5,973,361 A * | 10/1999 | Hshieh | .............. H01L 21/26586 257/341 |
| 6,172,791 B1 | 1/2001 | Gill et al. | |

(Continued)

FOREIGN PATENT DOCUMENTS

| | | |
|---|---|---|
| CN | 1859959 | 11/2006 |
| CN | 102645688 | 10/2014 |

(Continued)

OTHER PUBLICATIONS

U.S. Restriction Requirement dated May 8, 2019 in U.S. Appl. No. 16/001,694.

(Continued)

*Primary Examiner* — Andrew Jordan
(74) *Attorney, Agent, or Firm* — Weaver Austin Villeneuve & Sampson LLP

(57) ABSTRACT

A surface-relief structure and techniques for fabricating the surface-relief structure are disclosed. The surface-relief structure includes a substrate, a plurality of ridges on the substrate, and a plurality of grooves each between two adjacent ridges. The plurality of ridges are slanted with respect to the substrate, and include a material having a refractive index at least 2.3. Regions of the substrate at bottoms of the plurality of grooves include at least one of hydrogen or nitrogen at a concentration of at least $10^{10}/cm^3$.

20 Claims, 19 Drawing Sheets

(56) References Cited

U.S. PATENT DOCUMENTS

| | | | |
|---|---|---|---|
| 6,238,582 B1 | 5/2001 | Williams et al. | |
| 7,052,575 B1 | 5/2006 | Rangarajan et al. | |
| 7,172,973 B1 | 2/2007 | Foote et al. | |
| 7,357,138 B2 * | 4/2008 | Ji | B08B 7/00 134/1.1 |
| 7,767,561 B2 * | 8/2010 | Hanawa | H01J 37/32357 438/514 |
| 8,087,379 B2 | 1/2012 | Chandler et al. | |
| 8,494,320 B2 * | 7/2013 | Matsuda | H01S 5/1215 385/37 |
| 8,597,966 B2 * | 12/2013 | Hiratsuka | G02F 1/2257 438/31 |
| 9,182,596 B2 | 11/2015 | Border et al. | |
| 9,341,843 B2 | 5/2016 | Border et al. | |
| 9,390,935 B2 | 7/2016 | Tomura et al. | |
| 10,004,133 B2 | 6/2018 | Liang et al. | |
| 10,073,278 B2 | 9/2018 | Vallius | |
| 10,502,958 B2 | 12/2019 | Monhanty | |
| 10,684,407 B2 | 6/2020 | Monhanty | |
| 10,692,760 B2 * | 6/2020 | Sun | H01L 21/76837 |
| 10,727,072 B2 * | 7/2020 | Atikian | B81C 99/0095 |
| 2003/0206698 A1 | 11/2003 | Goldstein | |
| 2004/0011380 A1 * | 1/2004 | Ji | B08B 7/0035 134/1.1 |
| 2004/0014327 A1 * | 1/2004 | Ji | B08B 7/00 438/722 |
| 2004/0047313 A1 | 3/2004 | Rumpf et al. | |
| 2004/0129671 A1 * | 7/2004 | Ji | B08B 7/0035 216/58 |
| 2005/0211547 A1 | 9/2005 | Hanawa et al. | |
| 2006/0019477 A1 | 1/2006 | Hanawa et al. | |
| 2006/0045987 A1 | 3/2006 | Chandler et al. | |
| 2006/0127830 A1 | 6/2006 | Deng et al. | |
| 2008/0029716 A1 | 2/2008 | Chen | |
| 2009/0170331 A1 | 7/2009 | Cheng et al. | |
| 2010/0322557 A1 * | 12/2010 | Matsuda | H01S 5/1228 385/37 |
| 2012/0177908 A1 | 7/2012 | Petorak et al. | |
| 2012/0196139 A1 | 8/2012 | Petorak et al. | |
| 2013/0183780 A1 * | 7/2013 | Hiratsuka | H01L 21/308 438/31 |
| 2013/0192758 A1 | 8/2013 | Toth et al. | |
| 2014/0116621 A1 | 5/2014 | Mori et al. | |
| 2014/0251790 A1 | 9/2014 | Kodaira et al. | |
| 2015/0125976 A1 | 5/2015 | Wang | |
| 2015/0279686 A1 | 10/2015 | Kuo et al. | |
| 2015/0309316 A1 | 10/2015 | Osterhout et al. | |
| 2016/0035539 A1 | 2/2016 | Sainiemi et al. | |
| 2016/0042971 A1 | 2/2016 | Mohanty | |
| 2016/0187654 A1 | 6/2016 | Border et al. | |
| 2017/0031171 A1 | 2/2017 | Vallius et al. | |
| 2017/0059879 A1 | 3/2017 | Vallius | |
| 2017/0301519 A1 | 10/2017 | Naim et al. | |
| 2017/0307887 A1 | 10/2017 | Stenberg et al. | |
| 2017/0311430 A1 | 10/2017 | Liang et al. | |
| 2017/0352522 A1 | 12/2017 | Landis et al. | |
| 2018/0138047 A1 | 5/2018 | Atikian et al. | |
| 2019/0129089 A1 | 5/2019 | Monhanty | |
| 2019/0129180 A1 | 5/2019 | Monhanty | |
| 2019/0164820 A1 | 5/2019 | Sun et al. | |
| 2019/0212480 A1 | 7/2019 | Evans et al. | |
| 2020/0033530 A1 | 1/2020 | Colburn et al. | |
| 2020/0264362 A1 | 8/2020 | Monhanty | |
| 2020/0294851 A1 * | 9/2020 | Sun | H01L 21/76837 |

FOREIGN PATENT DOCUMENTS

| | | |
|---|---|---|
| CN | 111448485 | 7/2020 |
| CN | 111492315 A | 8/2020 |
| CN | 112313547 A | 2/2021 |
| EP | 1183684 B1 | 3/2000 |
| EP | 1228401 | 8/2005 |
| EP | 1855131 A1 | 11/2007 |
| EP | 3477347 | 1/2019 |
| EP | 3714297 | 9/2020 |
| EP | 3827292 | 6/2021 |
| JP | 2021503709 | 7/2020 |
| KR | 20200066733 | 6/2020 |
| TW | 201931954 | 8/2019 |
| WO | 2019089086 | 5/2019 |
| WO | 2019089639 | 5/2019 |
| WO | 2020023055 | 1/2020 |

OTHER PUBLICATIONS

U.S. Non-Final Office Action dated Aug. 20, 2019 in U.S. Appl. No. 16/001,694.
Notice of Allowance dated Feb. 7, 2020 in U.S. Appl. No. 16/001,694.
U.S. Office Action dated Apr. 1, 2019 in U.S. Appl. No. 16/174,305.
Notice of Allowance dated Aug. 1, 2019 in U.S. Appl. No. 16/174,305.
Notice of Allowance dated Oct. 30, 2019 in U.S. Appl. No. 16/174,305.
U.S. Office Action dated Jul. 27, 2020 in U.S. Appl. No. 16/046,407.
Restriction Requirement dated Apr. 8, 2020 in U.S. Appl. No. 16/046,407.
U.S. Final Office Action dated Feb. 4, 2021 in U.S. Appl. No. 16/046,407.
European Application No. EP18202897.7, "Extended European Search Report", dated Mar. 19, 2019, 10 pages.
International Application No. PCT/US2018/058272, "International Search Report and Written Opinion," dated Mar. 11, 2019, 14 pages.
International Application No. PCT/US2018/036515, "International Search Report and Written Opinion", dated Sep. 27, 2018, 15 pages.
International Application No. PCT/US2018/044068, "International Search Report and Written Opinion", dated Apr. 26, 2019, 14 pages.
Lee, et al., "Dry Etching of GaN Using Reactive Ion Beam Etching and Chemically Assisted Reactive Ion Beam Etching", MRS Proceedings, vol. 468, Jan. 1, 1997, 5 pages.
Miller, et al., "Design and Fabrication of Binary Slanted Surface-Relief Gratings for a Planar Optical Interconnection", Applied Optics, vol. 36, No. 23, Aug. 10, 1997, pp. 5717-5727.
Oxford Instruments, "Ionfab 300, Flexible Tools for Multiple Applications", 2015, retrieved from "https://plasma.oxinst.com/assets/uploads/Ionfab300_ 4.pdf" and printed on Mar. 19, 2019, 5 pages.
Rowe, et al., "High-Reflectivity Surface-Relief Gratings in Single-Mode Optical Fibers", IEE Proceedings-J/Optoelectronics, vol. 134, Issue 3, Jun. 1, 1987, 6 pages.
Notice of Allowance dated May 27, 2021 in U.S. Appl. No. 16/046,407.
U.S. Non-Final Office Action dated May 14, 2021 in U.S. Appl. No. 16/868,204.
International Application No. PCT/US2021/027845, "International Search Report and Written Opinion", dated Jul. 29, 2021, 8 pages.
European Application No. 18873779.5, "Extended European Search Report", dated Jan. 13, 2021, 10 pages.
European Application No. 18928063.9, "Partial Search Report", dated Aug. 13, 2021, 15 pages. No Translation.
Posseme, et al., "Alternative process for thin layer etching: Application to nitride spacer etching stopping on silicon germanium", Applied Physics Letters, vol. 105, No. 5, Aug. 4, 2014 (Aug. 4, 2014), 4 pages.
Gerasimenko, et al., "Changes in the optical properties of films of silicon nitride, silicon oxinitride, and silicon oxide upon ion irradiation", Translated from Zhurnal Prikiadnoi Spektroskopii, Journal of Applied Spectroscopy, vol. 26, No. 1, pp. 164-166, Jan. 31, 1977 (Jan. 31, 1977), 3 pages. Original article submitted Nov. 24, 1975.

* cited by examiner

HYDROGEN/NITROGEN DOPING AND CHEMICALLY ASSISTED ETCHING OF HIGH REFRACTIVE INDEX GRATINGS

BACKGROUND

An artificial reality system, such as a head-mounted display (HMD) or heads-up display (HUD) system, generally includes a display configured to present artificial images that depict objects in a virtual environment. The display may display virtual objects or combine images of real objects with virtual objects, as in virtual reality (VR), augmented reality (AR), or mixed reality (MR) applications. For example, in an AR system, a user may view both images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through).

One example optical see-through AR system may use a waveguide-based optical display, where light of projected images may be coupled into a waveguide (e.g., a substrate), propagate within the waveguide, and be coupled out of the waveguide at different locations. In some implementations, the light of the projected images may be coupled into or out of the waveguide using a diffractive optical element, such as a slanted surface-relief grating. In many cases, it may be challenging to fabricate the slanted surface-relief grating with the desired profile at a desirable speed.

SUMMARY

This disclosure relates generally to techniques for fabricating slanted structures, and more specifically, to techniques for etching slant structures on materials having high refractive indices (e.g., n>about 2.3), such as $TiO_x$, $LiNbO_3$, $HfO_x$, $TiSiO_x$, SiC, ZnSe, InGaAs, GaP, and the like. A chemically assisted reactive ion beam etch (CARIBE) technique may be used to etch the slanted structures, such as high symmetrical slanted structures or slanted structures in materials having ultra-high refractive indices.

According to some embodiments, a method of fabricating a slanted surface-relief structure in a material layer may include injecting a first reactive gas into a reactive ion source generator; generating a plasma from the first reactive gas in the reactive ion source generator, where the plasma may include first reactive ions having a first atomic weight and second reactive ions having a second atomic weight less than the first atomic weight; extracting at least some of the first reactive ions and at least some of the second reactive ions from the plasma to form a collimated reactive ion beam towards the material layer that has a refractive index at least 2.3; injecting a second reactive gas onto the material layer; and etching the material layer both physically and chemically with the collimated reactive ion beam and the second reactive gas to form the slanted surface-relief structure in the material layer.

In some embodiments, the material layer may include at least one of $TiO_x$, $LiNbO_3$, $HfO_x$, $TiSiO_x$, SiC, ZnSe, InGaAs, or GaP. In some embodiments, the first reactive ions may include nitrogen ions. In some embodiments, the second reactive ions may include hydrogen ions. In some embodiments, the first reactive gas may include at least one of $H_2$, $N_2$, $NF_3$, $NH_3$, $CH_4$, $CHF_3$, $Cl_2$, $BCl_3$, or HBr. In some embodiments, the first reactive gas may be free of oxygen or carbon. In some embodiments, the second reactive gas may include a fluorine-based reactive gas or a chlorine-based reactive gas or bromine-based reactive gas. In some embodiments, the second reactive gas may include at least one of $CF_4$, $NF_3$, $SF_6$, $Cl_2$, $BCl_3$, or HBr.

In some embodiments, extracting at least some of the first reactive ions and at least some of the second reactive ions from the plasma to form the collimated reactive ion beam may include applying an extraction voltage on an extraction grid adjacent to the reactive ion source generator, and applying an acceleration voltage on an acceleration grid to extract and accelerate at least some of the first reactive ions and at least some of the second reactive ions. The extraction grid and the acceleration grid may be aligned, and the acceleration voltage may be different from the extraction voltage.

In some embodiments, the slanted surface-relief structure may include a slanted surface-relief optical grating, and the slanted surface-relief optical grating may include a plurality of ridges. In some embodiments, a leading edge of each ridge of the plurality of ridges may be parallel to a trailing edge of the ridge. The slanted surface-relief optical grating may be characterized by at least one of: a slant angle of a leading edge of each ridge of the plurality of ridges and a slant angle of a trailing edge of the ridge greater than 30 degrees with respect to a surface normal of the material layer, a difference between a length of the leading edge and a length of the trailing edge less than 10% of the length of the trailing edge, a depth of the slanted surface-relief optical grating greater than 100 nm, or a duty cycle of the slanted surface-relief optical grating greater than 60%.

According to some embodiments, a method of fabricating a slanted surface-relief structure in a material layer may include injecting a first reactive gas that may include hydrogen and nitrogen into an reactive ion source generator; generating a plasma including nitrogen ions and hydrogen ions from the first reactive gas in the reactive ion source generator; extracting at least some of the nitrogen ions and at least some of the hydrogen ions from the reactive ion source generator to form a collimated reactive ion beam towards the material layer; injecting a second reactive gas that includes fluorine onto the material layer; and etching the material layer both physically and chemically with the collimated reactive ion beam and the second reactive gas to form the slanted surface-relief structure. The material layer may include at least one of $TiO_x$, $LiNbCO_3$, $HfO_x$, $TiSiO_x$, SiC, ZnSe, InGaAs, or GaP.

In some embodiments, the material layer may include a $TiO_x$ layer. At least some of the hydrogen ions and at least some of the nitrogen ions may react with the $TiO_x$ layer to form a $Ti_wH_xN_zF$, $Ti_wH_xN_zCl$, or $Ti_wH_xN_zBr$ layer. The second reactive gas may react with the $Ti_wH_xN_zF$, $Ti_wH_xN_zCl$, or $Ti_wH_xN_zBr$ layer to generate $TiF_4$, $TiCl_4$, or $TiBr_4$, and at least one of $O_2$, $CO_2$, or $H_2O$. In some embodiments, the material layer may include a SiC layer, and at least some of the hydrogen ions and at least some of the nitrogen ions may react with the SiC layer to form a $Si_wH_xN_yC_zF$, $Si_wH_xN_yC_zCl$, or $Si_wH_xN_yC_zBr$ layer. The second reactive gas may react with the $Si_wH_xN_yC_zF$ layer to generate $SiF_4$, $SiCl_4$, or $SiBr_4$, and at least one of $CH_4$, CN, $CF_4$, $CCl_4$, or $CBr_4$.

According to some embodiments, a surface-relief structure may include a substrate and a plurality of ridges on the substrate, and a plurality of grooves each between two adjacent ridges. The plurality of ridges may be slanted with respect to the substrate, and may include a material having a refractive index at least 2.3. Regions of the substrate at bottoms of the plurality of grooves may include at least one of hydrogen or nitrogen at a concentration of at least $10^{10}/cm^3$. In some embodiments, the material of the plurality of ridges may include at least one of $TiO_x$, $LiNbO_3$, $HfO_x$, $TiSiO_x$, SiC, ZnSe, InGaAs, or GaP. In some embodiments, the surface-relief structure may be characterized by at least one of: a leading edge of each ridge of the plurality of ridges parallel to a trailing edge of the ridge, a slant angle of the leading edge and a slant angle of the trailing edge greater than 30 degrees with respect to a surface normal of the substrate, a difference between a length of the leading edge and a length of the trailing edge less than 10% of the length of the trailing edge, a depth of the plurality of grooves greater than 100 nm, or a duty cycle of the surface-relief structure greater than 60%.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

Figure 1:
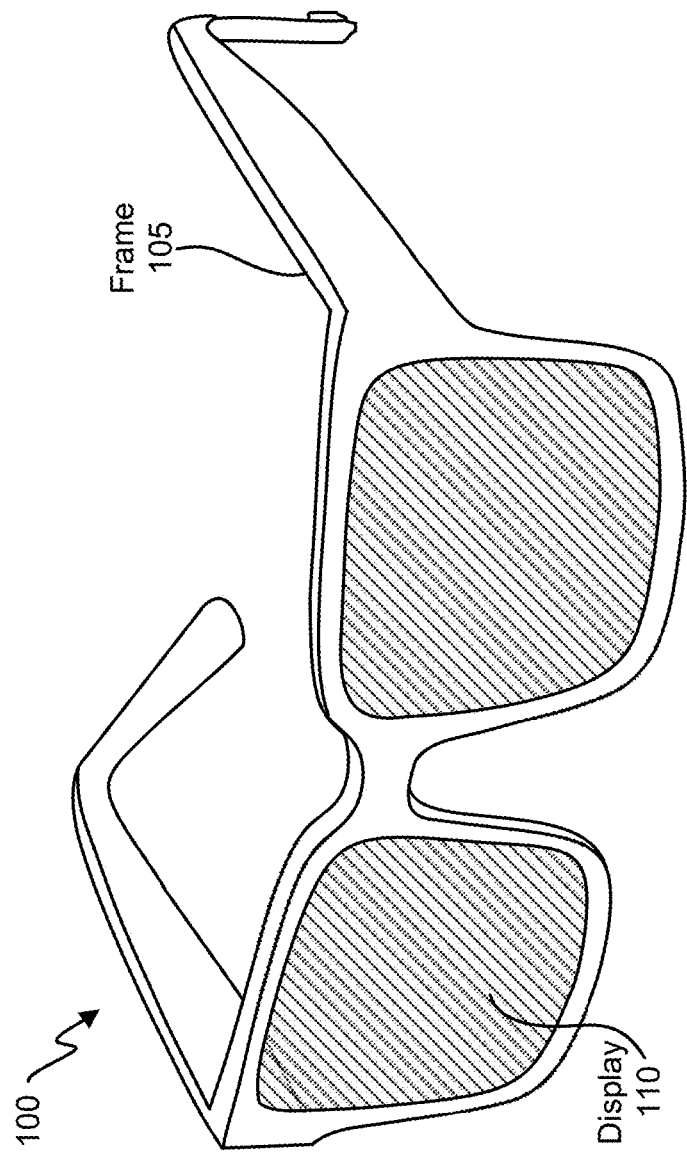
FIG. 1 is a simplified diagram of an example near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Techniques disclosed herein relate generally to micro- or nano-structure manufacturing. More specifically, and without limitation, this application relates to techniques for fabricating slanted micro- or nano-structures. Slanted structures may be used in many optical or electronic devices for manipulating behavior of light and/or electricity. For example, using slanted surface-relief gratings in waveguide-based artificial reality display device can improve the field of view, increase the brightness efficiency, and reduce display artifacts (e.g., rainbow artifacts). A large slant angle (e.g., >45°) and/or a high depth may also be desired for improved performance of the slanted gratings.

In some waveguide display systems, it is desirable to using surface-relief gratings etched in materials having high refractive indices (e.g., n>about 2.3), such as $TiO_x$, $LiNbO_3$, $HfO_x$, $TiSiO_x$, SiC, ZnSe, InGaAs, GaP, and the like, such that a single surface-relief grating on a single waveguide can cover the three primary colors and the full field of view at a high efficiency. The single plate structure can also reduce weight, improve see-through quality, and reduce optical artifacts of the waveguide display systems. However, it can be challenging to fabricate deep surface-relief gratings with symmetrical grating ridges (e.g., substantially parallel leading edges and trailing edges) in such high index materials. For example, existing $TiO_x$ or SiC etching techniques may cause large base and undesired profile for the slanted structure.

According to certain embodiments, a chemically assisted reactive ion beam etching process may be implemented to more efficiently and more accurately fabricate slanted gratings in materials having an ultra-high refractive index (e.g., 2.3, 2.4, 2.5, 2.6, or greater). The materials having ultra-high refractive indices may be referred to as ultra-high-index materials. In some embodiments, hydrogen and nitrogen may be added to an ion source generator to generate hydrogen ions and nitrogen ions. The hydrogen ions and nitrogen ions may dope, modify, and/or break bonds in the ultra-high-index materials to be etched, thus facilitating the etching and removing of the ultra-high-index materials.

Without intending to be bound to any particular theory, nitrogen ions, being heavier than hydrogen ions, may break some bonds that may not be broken by hydrogen ions, such that the ultra-high-index materials may be more easily etched. Hydrogen ions, given its relatively small size, may penetrate deeper into the ultra-high-index materials to disrupt the crystal structure and/or bonds of the ultra-high-index materials to further facilitate the etching process. Thus, the ultra-high-index materials may be doped and/or modified by the hydrogen ions and/or the nitrogen ions. The doped and/or modified ultra-high-index materials may react with one or more reactive gas species to form volatile materials, which can be easily removed. Reactive gas species, such as a fluorine-based reactive gas, may be added to the ion source generator and/or may be applied on the ultra-high-index materials to be etched through a gas ring bypassing the ion source generator. By doping and/or modifying the ultra-high-index materials with hydrogen and/or nitrogen and etching the doped and/or modified ultra-high-index materials with fluorine-based gas species, symmetric and/or deep slanted gratings may be more efficiently and more accurately fabricated.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof.

FIG. 1 is a simplified diagram of an example of a near-eye display 100 according to certain embodiments. Near-eye display 100 may present media to a user. Examples of media presented by near-eye display 100 may include one or more images, video, and/or audio. In some embodiments, audio may be presented via an external device (e.g., speakers and/or headphones) that receives audio information from near-eye display 100, a console, or both, and presents audio data based on the audio information. Near-eye display 100 is generally configured to operate as an artificial reality display. In some embodiments, near-eye display 100 may operate as an augmented reality (AR) display or a mixed reality (MR) display.

Near-eye display 100 may include a frame 105 and a display 110. Frame 105 may be coupled to one or more optical elements. Display 110 may be configured for the user to see content presented by near-eye display 100. In some embodiments, display 110 may include a waveguide display assembly for directing light from one or more images to an eye of the user.

Figure 2:
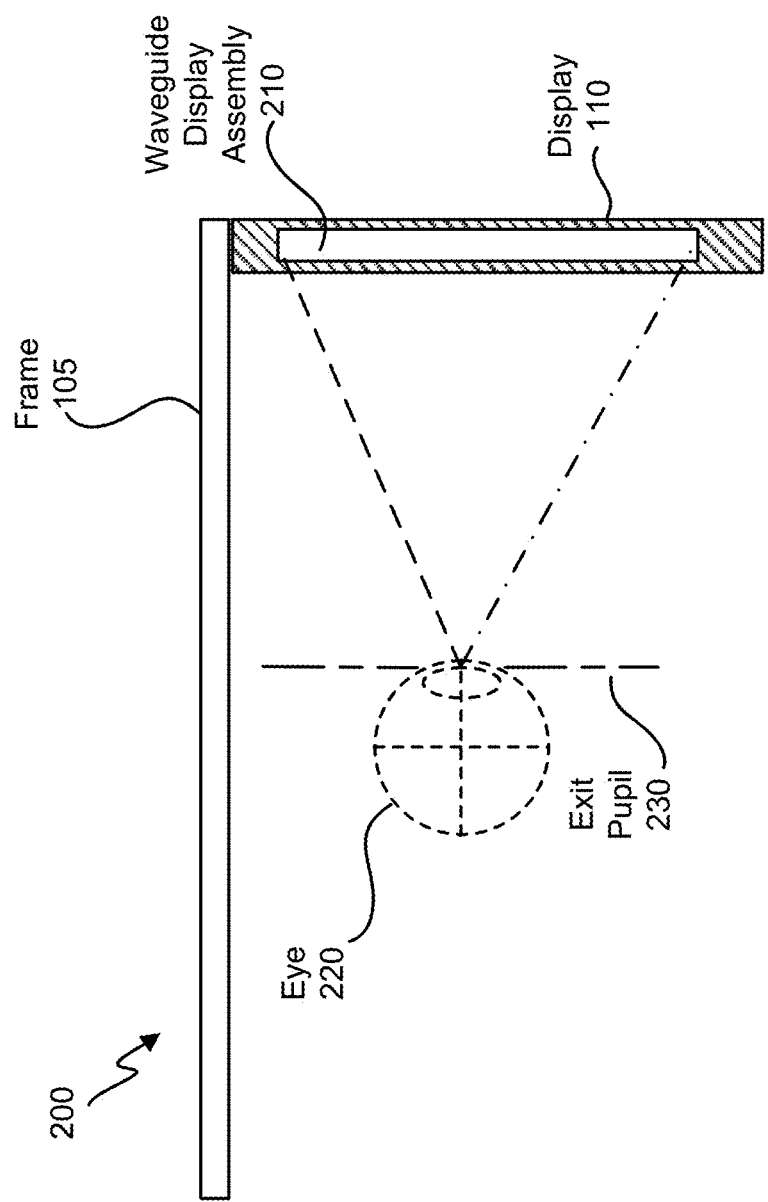
FIG. 2 is a cross-sectional view of an example near-eye display according to certain embodiments.

FIG. 2 is a cross-sectional view 200 of near-eye display 100 illustrated in FIG. 1. Display 110 may include may include at least one waveguide display assembly 210. An exit pupil 230 may be located at a location where a user's eye 220 is positioned when the user wears near-eye display 100. For purposes of illustration, FIG. 2 shows cross-sectional view 200 associated with user's eye 220 and a single waveguide display assembly 210, but, in some embodiments, a second waveguide display may be used for the second eye of the user.

Waveguide display assembly 210 may be configured to direct image light (i.e., display light) to an eyebox located at exit pupil 230 and to user's eye 220. Waveguide display assembly 210 may include one or more materials (e.g., plastic, glass, etc.) with one or more refractive indices. In some embodiments, near-eye display 100 may include one or more optical elements between waveguide display assembly 210 and user's eye 220.

In some embodiments, waveguide display assembly 210 may include a stack of one or more waveguide displays including, but not restricted to, a stacked waveguide display, a varifocal waveguide display, etc. The stacked waveguide display is a polychromatic display (e.g., a red-green-blue (RGB) display) created by stacking waveguide displays whose respective monochromatic sources are of different colors. The stacked waveguide display may also be a polychromatic display that can be projected on multiple planes (e.g. multi-planar colored display). In some configurations, the stacked waveguide display may be a monochromatic display that can be projected on multiple planes (e.g. multi-planar monochromatic display). The varifocal waveguide display is a display that can adjust a focal position of image light emitted from the waveguide display. In alternate embodiments, waveguide display assembly 210 may include the stacked waveguide display and the varifocal waveguide display.

Figure 3:
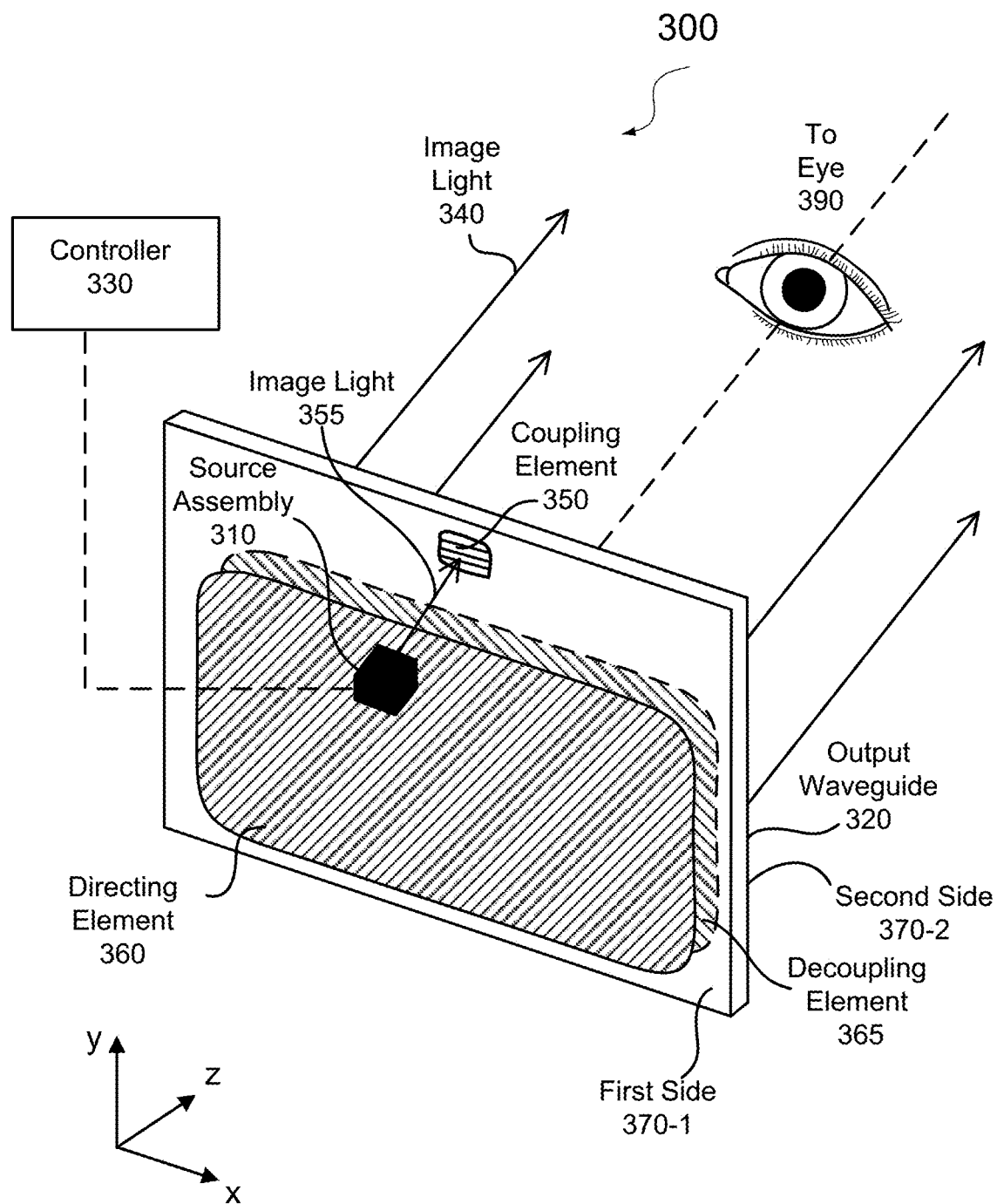
FIG. 3 is an isometric view of an example waveguide display according to certain embodiments.

FIG. 3 is an isometric view of an embodiment of a waveguide display 300. In some embodiments, waveguide display 300 may be a component (e.g., waveguide display assembly 210) of near-eye display 100. In some embodiments, waveguide display 300 may be part of some other near-eye displays or other systems that may direct image light to a particular location.

Waveguide display 300 may include a source assembly 310, an output waveguide 320, and a controller 330. For purposes of illustration, FIG. 3 shows waveguide display 300 associated with a user's eye 390, but in some embodiments, another waveguide display separate, or partially separate, from waveguide display 300 may provide image light to another eye of the user.

Source assembly 310 may generate image light 355 for display to the user. Source assembly 310 may generate and output image light 355 to a coupling element 350 located on a first side 370-1 of output waveguide 320. In some embodiments, coupling element 350 may couple image light 355 from source assembly 310 into output waveguide 320. Coupling element 350 may include, for example, a diffraction grating, a holographic grating, one or more cascaded reflectors, one or more prismatic surface elements, and/or an array of holographic reflectors. Output waveguide 320 may be an optical waveguide that can output expanded image light 340 to user's eye 390. Output waveguide 320 may receive image light 355 at one or more coupling elements 350 located on first side 370-1 and guide received image light 355 to a directing element 360.

Directing element 360 may redirect received input image light 355 to decoupling element 365 such that received input image light 355 may be coupled out of output waveguide 320 via decoupling element 365. Directing element 360 may be part of, or affixed to, first side 370-1 of output waveguide 320. Decoupling element 365 may be part of, or affixed to, a second side 370-2 of output waveguide 320, such that directing element 360 is opposed to decoupling element 365. Directing element 360 and/or decoupling element 365 may include, for example, a diffraction grating, a holographic grating, a surface-relief grating, one or more cascaded reflectors, one or more prismatic surface elements, and/or an array of holographic reflectors.

Second side 370-2 of output waveguide 320 may represent a plane along an x-dimension and a y-dimension. Output waveguide 320 may include one or more materials that can facilitate total internal reflection of image light 355. Output waveguide 320 may include, for example, silicon, plastic, glass, and/or polymers. Output waveguide 320 may have a relatively small form factor. For example, output waveguide 320 may be approximately 50 mm wide along the x-dimension, about 30 mm long along the y-dimension, and about 0.5 to 1 mm thick along a z-dimension.

Controller 330 may control scanning operations of source assembly 310. Controller 330 may determine scanning instructions for source assembly 310. In some embodiments, output waveguide 320 may output expanded image light 340 to user's eye 390 with a large field of view (FOV). For example, expanded image light 340 provided to user's eye 390 may have a diagonal FOV (in x and y) of about 60 degrees or greater and/or about 150 degrees or less. Output waveguide 320 may be configured to provide an eyebox with a length of about 20 mm or greater and/or equal to or less than about 50 mm, and/or a width of about 10 mm or greater and/or equal to or less than about 50 mm.

Figure 4:
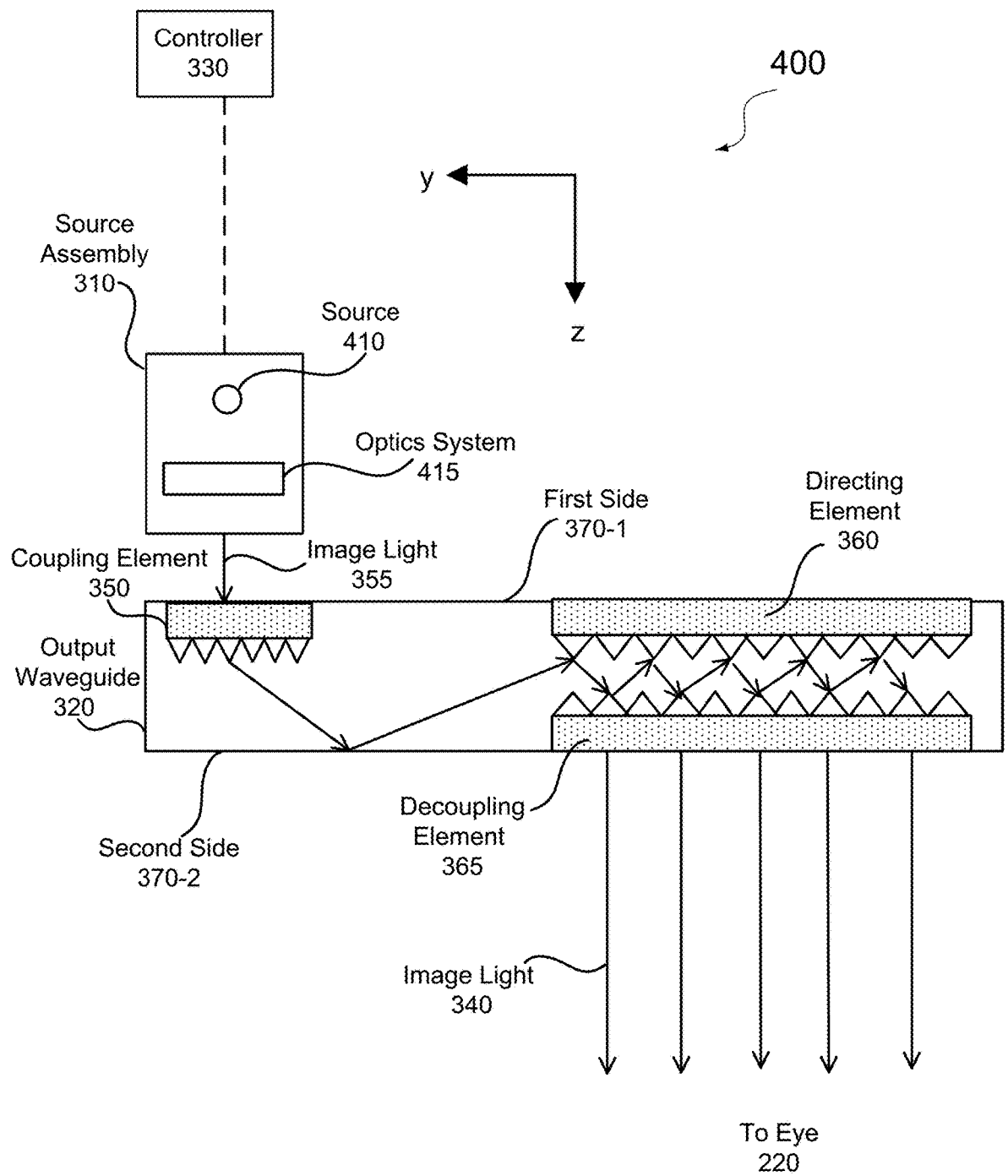
FIG. 4 is a cross-sectional view of an example waveguide display according to certain embodiments.

FIG. 4 is a cross-sectional view 400 of waveguide display 300. Waveguide display 300 may include source assembly 310 and output waveguide 320. Source assembly 310 may generate image light 355 (i.e., display light) in accordance with scanning instructions from controller 330. Source assembly 310 may include a source 410 and an optics system 415. Source 410 may include a light source that generates coherent or partially coherent light. Source 410 may include, for example, a laser diode, a vertical cavity surface emitting laser, and/or a light emitting diode.

Optics system 415 may include one or more optical components that can condition the light from source 410. Conditioning light from source 410 may include, for example, expanding, collimating, and/or adjusting orientation in accordance with instructions from controller 330. The one or more optical components may include one or more lenses, liquid lenses, mirrors, apertures, and/or gratings. Light emitted from optics system 415 (and also source assembly 310) may be referred to as image light 355 or display light.

Output waveguide 320 may receive image light 355 from source assembly 310. Coupling element 350 may couple image light 355 from source assembly 310 into output waveguide 320. In embodiments where coupling element 350 includes a diffraction grating, the diffraction grating may be configured such that total internal reflection may occur within output waveguide 320, and thus image light 355 coupled into output waveguide 320 may propagate internally within output waveguide 320 (e.g., by total internal reflection) toward decoupling element 365.

Directing element 360 may redirect image light 355 toward decoupling element 365 for coupling at least a portion of the image light out of output waveguide 320. In embodiments where directing element 360 is a diffraction grating, the diffraction grating may be configured to cause incident image light 355 to exit output waveguide 320 at angle(s) of inclination relative to a surface of decoupling element 365. In some embodiments, directing element 360 and/or the decoupling element 365 may be structurally similar.

Expanded image light 340 exiting output waveguide 320 may be expanded along one or more dimensions (e.g., elongated along the x-dimension). In some embodiments, waveguide display 300 may include a plurality of source assemblies 310 and a plurality of output waveguides 320. Each of source assemblies 310 may emit a monochromatic image light corresponding to a primary color (e.g., red, green, or blue). Each of output waveguides 320 may be stacked together to output an expanded image light 340 that may be multi-colored.

Figure 5:
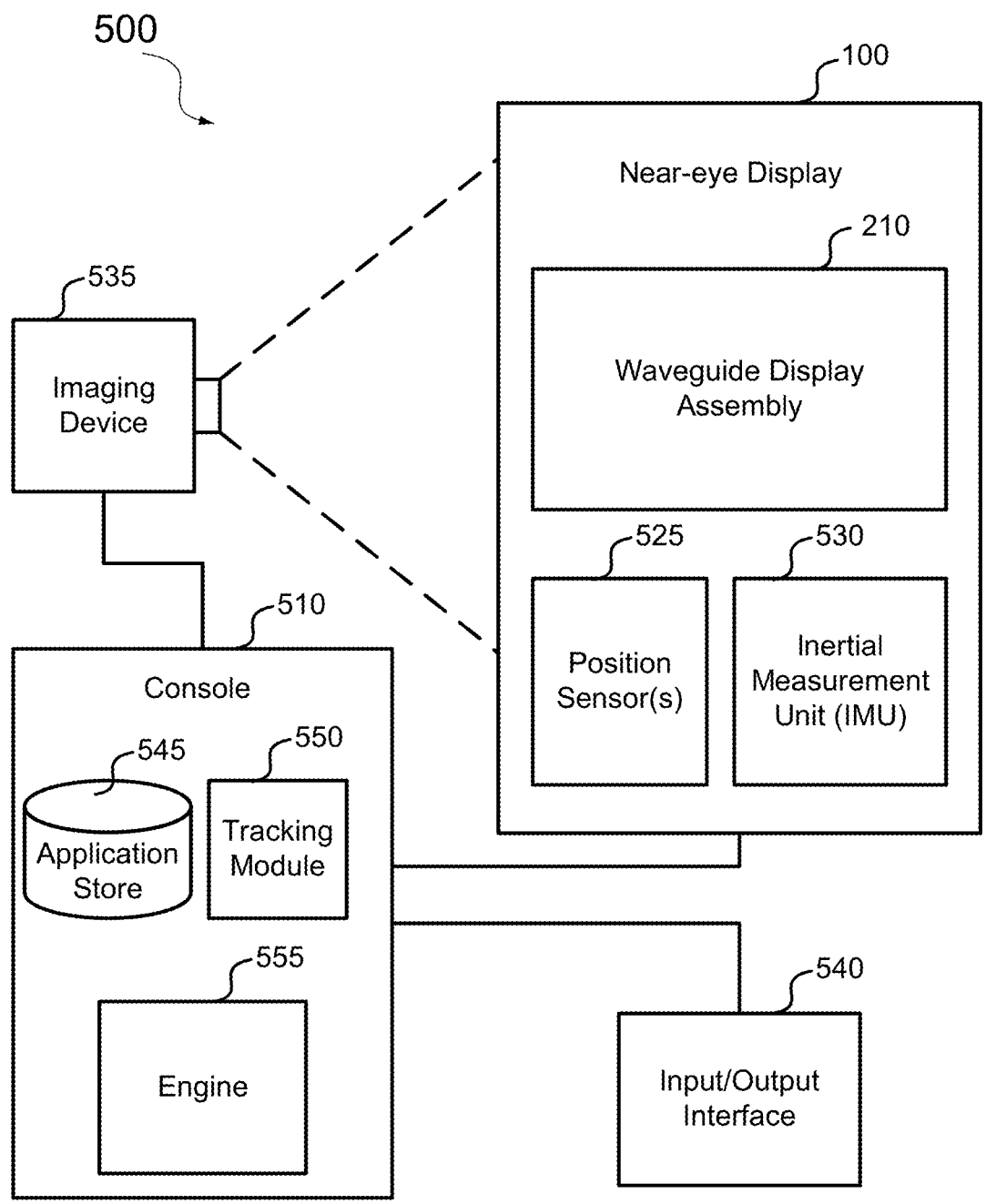
FIG. 5 is a simplified block diagram of an example artificial reality system including a waveguide display.

FIG. 5 is a simplified block diagram of an example of an artificial reality system 500 including waveguide display assembly 210. System 500 may include near-eye display 100, an imaging device 535, and an input/output interface 540 that are each coupled to a console 510.

As described above, near-eye display 100 may be a display that presents media to a user. Examples of media presented by near-eye display 100 may include one or more images, video, and/or audio. In some embodiments, audio may be presented via an external device (e.g., speakers and/or headphones) that may receive audio information from near-eye display 100 and/or console 510 and present audio data based on the audio information to a user. In some embodiments, near-eye display 100 may act as an artificial reality eyewear glass. For example, in some embodiments, near-eye display 100 may augment views of a physical, real-world environment, with computer-generated elements (e.g., images, video, sound, etc.).

Near-eye display 100 may include waveguide display assembly 210, one or more position sensors 525, and/or an inertial measurement unit (IMU) 530. Waveguide display assembly 210 may include a waveguide display, such as waveguide display 300 that includes source assembly 310, output waveguide 320, and controller 330 as described above.

IMU 530 may include an electronic device that can generate fast calibration data indicating an estimated position of near-eye display 100 relative to an initial position of near-eye display 100 based on measurement signals received from one or more position sensors 525.

Imaging device 535 may generate slow calibration data in accordance with calibration parameters received from console 510. Imaging device 535 may include one or more cameras and/or one or more video cameras.

Input/output interface 540 may be a device that allows a user to send action requests to console 510. An action request may be a request to perform a particular action. For example, an action request may be to start or end an application or to perform a particular action within the application.

Console 510 may provide media to near-eye display 100 for presentation to the user in accordance with information received from one or more of: imaging device 535, near-eye display 100, and input/output interface 540. In the example shown in FIG. 5, console 510 may include an application store 545, a tracking module 550, and an engine 555.

Application store 545 may store one or more applications for execution by the console 510. An application may include a group of instructions that, when executed by a processor, may generate content for presentation to the user. Examples of applications may include gaming applications, conferencing applications, video playback application, or other suitable applications.

Tracking module 550 may calibrate system 500 using one or more calibration parameters and may adjust one or more calibration parameters to reduce error in determination of the position of near-eye display 100. Tracking module 550 may track movements of near-eye display 100 using slow calibration information from imaging device 535. Tracking module 550 may also determine positions of a reference point of near-eye display 100 using position information from the fast calibration information.

Engine 555 may execute applications within system 500 and receives position information, acceleration information, velocity information, and/or predicted future positions of near-eye display 100 from tracking module 550. In some embodiments, information received by engine 555 may be used for producing a signal (e.g., display instructions) to waveguide display assembly 210. The signal may determine a type of content to present to the user.

There may be many different ways to implement the waveguide display. For example, in some implementations, output waveguide 320 may include a slanted surface between first side 370-1 and second side 370-2 for coupling image light 355 into output waveguide 320. In some implementations, the slanted surface may be coated with a reflective coating to reflect light towards directing element 360. In some implementations, the angle of the slanted surface may be configured such that image light 355 may be reflected by the slanted surface due to total internal reflection. In some implementations, directing element 360 may not be used, and light may be guided within output waveguide 320 by total internal reflection. In some implementations, decoupling elements 365 may be located near first side 370-1.

In some implementations, output waveguide 320 and decoupling element 365 (and directing element 360 if used) may be transparent to light from the environment, and may act as an optical combiner for combining image light 355 and light from the physical, real-world environment in front of near-eye display 100. As such, the user can view both artificial images of artificial objects from source assembly 310 and real images of real objects in the physical, real-world environment, which may be referred to as optical see-through.

Figure 6:
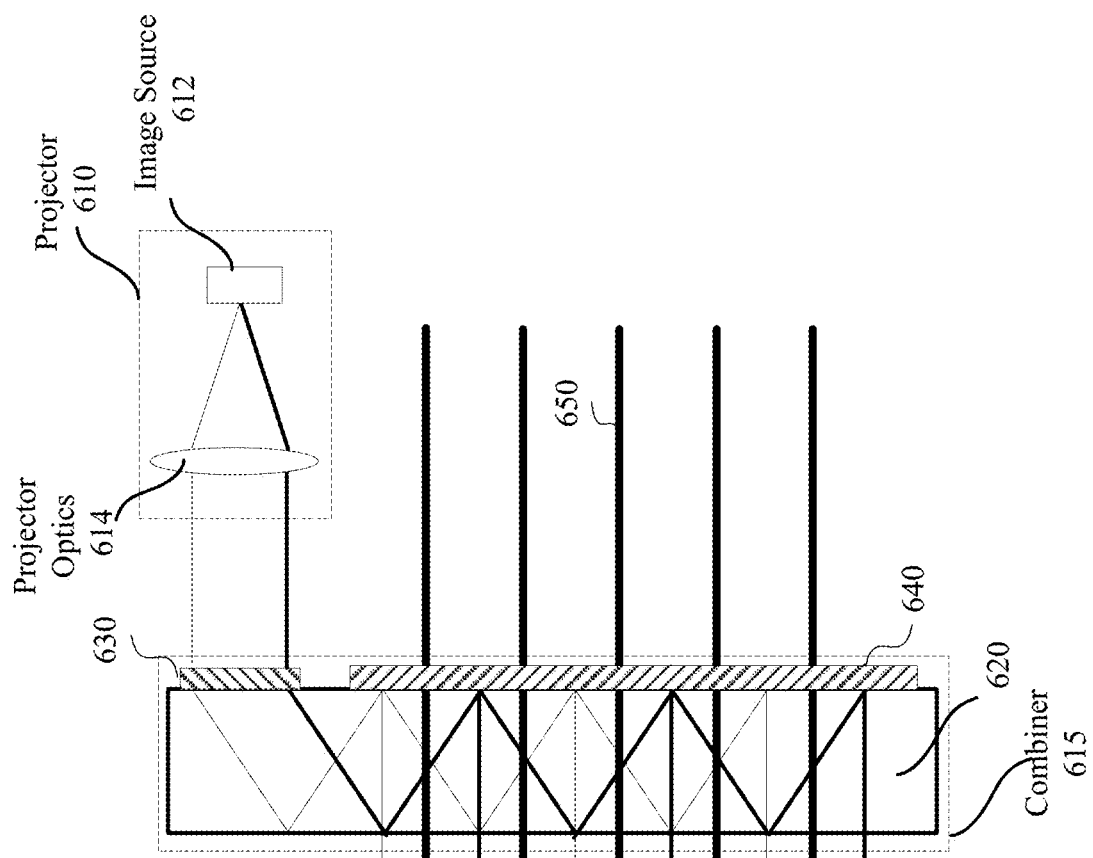
FIG. 6 illustrates an example optical see-through augmented reality system using a waveguide display according to certain embodiments.

FIG. 6 illustrates an example optical see-through augmented reality system 600 using a waveguide display according to certain embodiments. Augmented reality system 600 may include a projector 610 and a combiner 615. Projector 610 may include a light source or image source 612 and projector optics 614. In some embodiments, image source 612 may include a plurality of pixels that displays virtual objects, such as an LCD display panel or an LED display panel. In some embodiments, image source 612 may include a light source that generates coherent or partially coherent light. For example, image source 612 may include a laser diode, a vertical cavity surface emitting laser, and/or a light emitting diode. In some embodiments, image source 612 may include a plurality of light sources each emitting a monochromatic image light corresponding to a primary color (e.g., red, green, or blue). In some embodiments, image source 612 may include an optical pattern generator, such as a spatial light modulator. Projector optics 614 may include one or more optical components that can condition the light from image source 612, such as expanding, collimating, scanning, or projecting light from image source 612 to combiner 615. The one or more optical components may include, for example, one or more lenses, liquid lenses, mirrors, apertures, and/or gratings. In some embodiments, projector optics 614 may include a liquid lens (e.g., a liquid crystal lens) with a plurality of electrodes that allows scanning of the light from image source 612.

Combiner 615 may include an input coupler 630 for coupling light from projector 610 into a substrate 620 of combiner 615. Input coupler 630 may include a volume holographic grating, a diffractive optical elements (DOE) (e.g., a surface-relief grating), or a refractive coupler (e.g., a wedge or a prism). Input coupler 630 may have a coupling efficiency of greater than 30%, 50%, 75%, 90%, or higher for visible light. As used herein, visible light may refer to light with a wavelength between about 380 nm to about 750 nm. Light coupled into substrate 620 may propagate within substrate 620 through, for example, total internal reflection (TIR). Substrate 620 may be in the form of a lens of a pair of eyeglasses. Substrate 620 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 620 may be transparent to visible light. A material may be "transparent" to a light beam if the light beam can pass through the material with a high transmission rate, such as larger than 50%, 60%, 75%, 80%, 90%, 95%, or higher, where a small portion of the light beam (e.g., less than 50%, 40%, 25%, 20%, 10%, 5%, or less) may be scattered, reflected, or absorbed by the material. The transmission rate (i.e., transmissivity) may be represented by either a photopically weighted or an unweighted average transmission rate over a range of wavelengths, or the lowest transmission rate over a range of wavelengths, such as the visible wavelength range.

Substrate 620 may include or may be coupled to a plurality of output couplers 640 configured to extract at least a portion of the light guided by and propagating within substrate 620 from substrate 620, and direct extracted light 660 to an eye 690 of the user of augmented reality system 600. As input coupler 630, output couplers 640 may include grating couplers (e.g., volume holographic gratings or surface-relief gratings), other DOEs, prisms, etc. Output couplers 640 may have different coupling (e.g., diffraction) efficiencies at different locations. Substrate 620 may also allow light 650 from environment in front of combiner 615 to pass through with little or no loss. Output couplers 640 may also allow light 650 to pass through with little loss. For example, in some implementations, output couplers 640 may have a low diffraction efficiency for light 650 such that light 650 may be refracted or otherwise pass through output couplers 640 with little loss. In some implementations, output couplers 640 may have a high diffraction efficiency for light 650 and may diffract light 650 to certain desired directions (i.e., diffraction angles) with little loss. As a result, the user may be able to view combined images of the environment in front of combiner 615 and virtual objects projected by projector 610.

Figure 7:
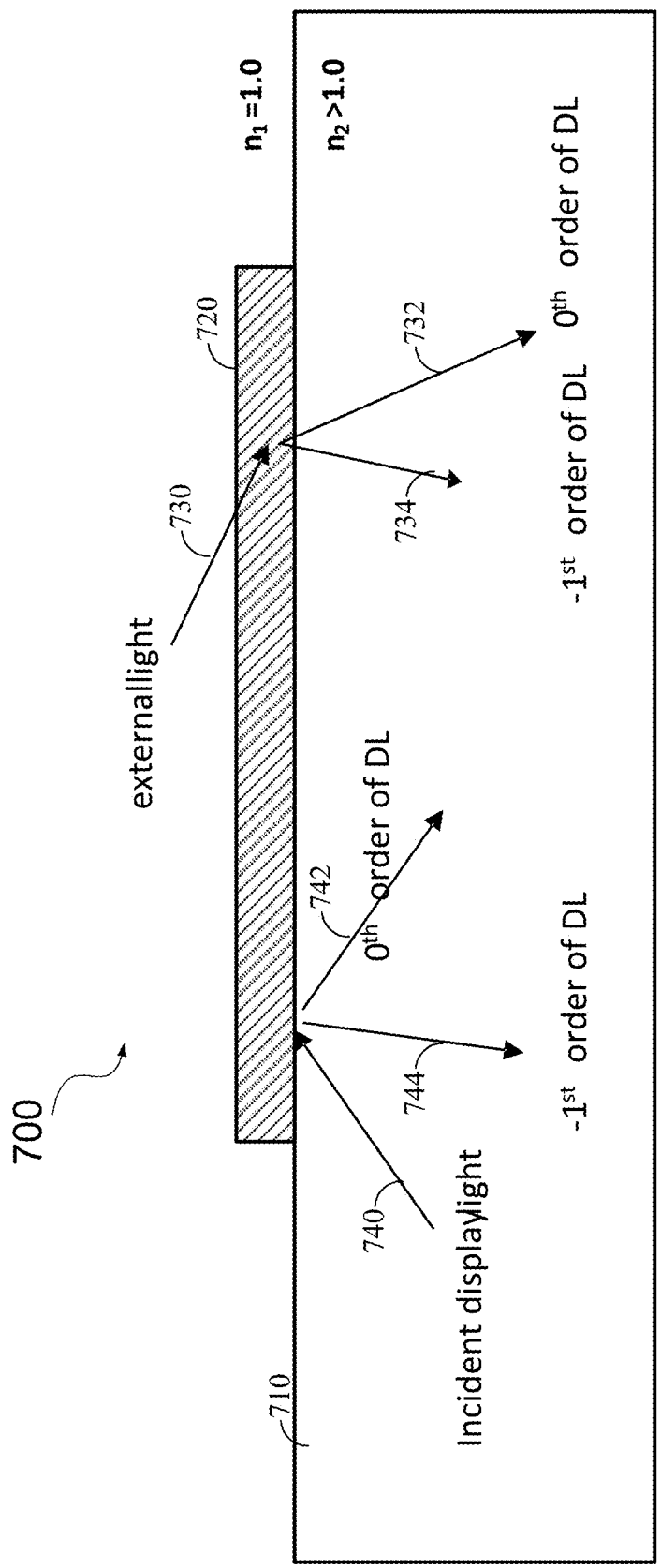
FIG. 7 illustrates propagations of display light and external light in an example waveguide display.

FIG. 7 illustrates propagations of incident display light 740 and external light 730 in an example waveguide display 700 including a waveguide 710 and a grating coupler 720. Waveguide 710 may be a flat or curved transparent substrate with a refractive index $n_2$ greater than the free space refractive index m (i.e., 1.0). Grating coupler 720 may include, for example, a Bragg grating or a surface-relief grating.

Incident display light 740 may be coupled into waveguide 710 by, for example, input coupler 630 of FIG. 6 or other couplers (e.g., a prism or slanted surface) described above. Incident display light 740 may propagate within waveguide 710 through, for example, total internal reflection. When incident display light 740 reaches grating coupler 720, incident display light 740 may be diffracted by grating coupler 720 into, for example, a $0^{th}$ order diffraction (i.e., reflection) light 742 and a −1st order diffraction light 744. The $0^{th}$ order diffraction may continue to propagate within waveguide 710, and may be reflected by the bottom surface of waveguide 710 towards grating coupler 720 at a different location. The −1st order diffraction light 744 may be coupled (e.g., refracted) out of waveguide 710 towards the user's eye, because a total internal reflection condition may not be met at the bottom surface of waveguide 710 due to the diffraction angle of the $-1^{st}$ order diffraction light 744.

External light 730 may also be diffracted by grating coupler 720 into, for example, a $0^{th}$ order diffraction light 732 or a −1st order diffraction light 734. The $0^{th}$ order diffraction light 732 or the −1st order diffraction light 734 may be refracted out of waveguide 710 towards the user's eye. Thus, grating coupler 720 may act as an input coupler for coupling external light 730 into waveguide 710, and may also act as an output coupler for coupling incident display light 740 out of waveguide 710. As such, grating coupler 720 may act as a combiner for combining external light 730 and incident display light 740 and send the combined light to the user's eye.

In order to diffract light at a desired direction towards the user's eye and to achieve a desired diffraction efficiency for certain diffraction orders, grating coupler 720 may include a blazed or slanted grating, such as a slanted Bragg grating or surface-relief grating, where the grating ridges and grooves may be tilted relative to the surface normal of grating coupler 720 or waveguide 710.

As described above, the grating coupler may not only diffract the display light, but also diffract the external light. In addition, due to the chromatic dispersion of the grating, lights of different colors may be diffracted at different angles for diffraction orders greater or less than zero. As such, the −1st order diffractions of external light of different colors that may reach the user's eye (e.g., diffraction light 734) may appear as ghost images located at different locations (or directions), which may be referred to as a rainbow artifact or rainbow ghost. The rainbow ghost may appear on top of the displayed image or the image of the environment, and disrupt the displayed image or the image of the environment. The rainbow ghost may significantly impact the user experience. In some cases, the rainbow ghost may also be dangerous to user's eye when the light from external light source (e.g., the sun) is directed to user's eye with a high efficiency.

The rainbow ghost caused by the diffraction of external light by a grating coupler of a waveguide display may be reduced using certain techniques disclosed herein. For example, in some embodiments, a slanted grating including a plurality of slanted ridges may be used as the grating coupler, where a height of the slanted ridges may be close to an integer multiple of the period of the slanted grating divided by the tangent of the slant angle of the slanted ridges. In one example, the height and the slant angle of the slanted ridges of the slanted grating may be designed so that the height of the grating is equal to or close to the period of the slanted grating divided by the tangent of the slant angle of the slanted ridges. In other words, a top left (or right) point on a first ridge of the slanted grating may be vertically aligned with a bottom left (or right) point of a second ridge of the slanted grating. Thus, the slanted grating may include two overlapped slanted gratings with an offset of about a half of the grating period between the two slanted gratings. As a result, external light diffracted by the two offset slanted gratings (e.g., the −1st order diffraction) may be out of phase by about 180°, and thus may destructively interfere with each other such that most of the external light may enter the waveguide as the $0^{th}$ order diffraction, which may not be wavelength dependent. The efficiency of the −1st order transmissive diffraction of the grating coupler for the external light can be much lower than that of the −1st order reflective diffraction of the grating coupler for the display light. For example, the efficiency for the −1st order diffraction of the display light may be greater than about 5%, about 20%, about 30%, about 50%, about 75%, about 90%, or higher, while the efficiency for the −1st order diffraction of the external light may be less than about 2%, less than about 1%, less than about 0.5%, or lower. In this way, the rainbow ghost caused by the −1st order diffraction of external light by the grating coupler may be reduced or eliminated.

Figure 8:
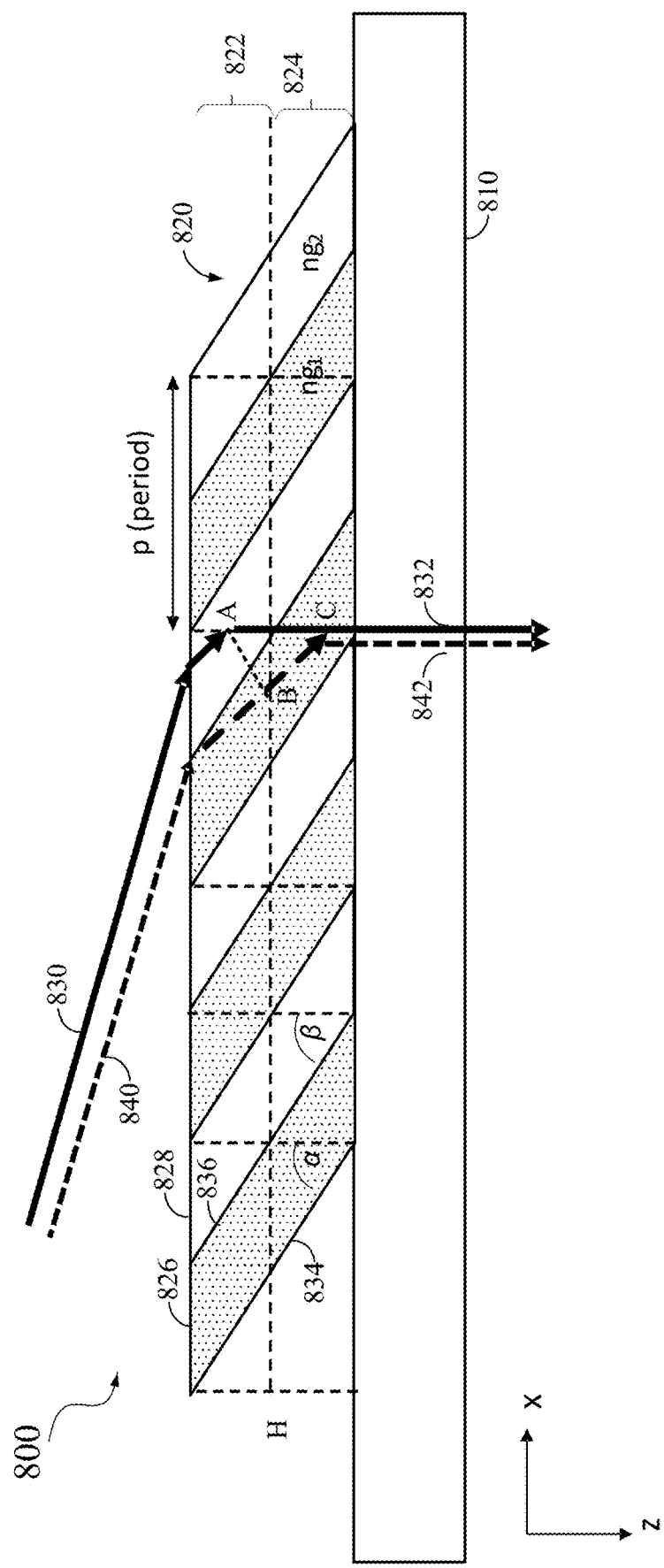
FIG. 8 illustrates an example slanted grating coupler in an example waveguide display according to certain embodiments.

FIG. 8 illustrates an example of a slanted grating coupler 820 in an example of a waveguide display 800 according to certain embodiments. Waveguide display 800 may include grating coupler 820 on a waveguide 810, such as substrate 620. Grating coupler 820 may act as a grating coupler for couple light into or out of waveguide 810. In some embodiments, grating coupler 820 may include a periodic structure with a period p. For example, grating coupler 820 may include a plurality of ridges 826 and grooves 828 between ridges 826. Each period of grating coupler 820 may include a ridge 826 and a groove 828, which may be an air gap or a region filled with a material with a refractive index $n_{g2}$. The ratio between the width of a ridge 826 and the grating period p may be referred to as duty cycle. Grating coupler 820 may have a duty cycle ranging, for example, from about 10% to about 90% or greater. In some embodiments, the duty cycle may vary from period to period. In some embodiments, the period p of the slanted grating may vary from one area to another on grating coupler 820, or may vary from one period to another (i.e., chirped) on grating coupler 820.

Ridges 826 may be made of a material with a refractive index of $n_{g1}$, such as silicon containing materials (e.g., $SiO_2$, $Si_3N_4$, SiC, $SiO_xN_y$, or amorphous silicon), organic materials (e.g., spin on carbon (SOC) or amorphous carbon layer (ACL) or diamond like carbon (DLC)), or inorganic metal oxide layers (e.g., $TiO_x$, $AlO_x$, $TaO_x$, $HfO_x$, etc.) or other multi-element compounds (e.g., ZnSe, InGaAs, GaP, etc.). Each ridge 826 may include a leading edge 834 with a slant angel α and a trailing edge 836 with a slant angle β. In some embodiments, leading edge 834 and training edge 836 of each ridge 826 may be parallel to each other. In other words, slant angle α is approximately equal to slant angle β. In some embodiments, slant angle α may be different from slant angle β. In some embodiments, slant angle α may be approximately equal to slant angle β. For example, the difference between slant angle α and slant angle β may be less than 20%, 10%, 5%, 1%, or less. In some embodiments, slant angle α and slant angle β may range from, for example, about 30° or less to about 70% or larger.

In some implementations, grooves 828 between the ridges 826 may be over-coated or filled with a material having a refractive index $n_{g2}$ higher or lower than the refractive index of the material of ridges 826. For example, in some embodiments, a high refractive index material, such as Hafnia, Titania, Tantalum oxide, Tungsten oxide, Zirconium oxide, Gallium sulfide, Gallium nitride, Gallium phosphide, silicon, and a high refractive index polymer, may be used to fill grooves 828. In some embodiments, a low refractive index material, such as silicon oxide, alumina, porous silica, or fluorinated low index monomer (or polymer), may be used to fill grooves 828. As a result, the difference between the refractive index of the ridges and the refractive index of the grooves may be greater than 0.1, 0.2, 0.3, 0.5, 1.0, or higher.

In some implementations, one of first slanted region and second slanted region may be an air gap with a refractive index of about 1.0. First slanted region and second slanted region may have a slant angle α with respect to the z (vertical) direction. The height (If) of first slanted region and second slanted region may be equal or close to (e.g., within about 5% or 10% of) an integer multiple (m) of the grating period p divided by the tangent of the slant angle α, i.e., $$H \times \tan(\alpha) \cong m \times p.$$

In the example shown in FIG. 8, m is equal to 1. Thus, the top left point of a first slanted region in a grating period may align vertically with the bottom left point of another first slanted region in a different grating period. Grating coupler 820 may thus include a first (top) slanted grating 822 and a second (bottom) slanted grating 824 each having a height of H/2. First slanted grating 822 and a second slanted grating 824 may be offset from each other in the x direction by p/2. In other embodiments, m may be equal to or greater than 2. For example, grating coupler 820 may include four overlapped slanted gratings each having a height of H/4 and offset from each other by a half grating period (p/2) in the x direction.

External light (e.g., a plane wave) incident on grating coupler 820 may include a first portion (external light 830) and a second portion (external light 840) that may have the same phase. External light 830 may be refracted into grating coupler 820 and diffracted by first slanted grating 822 into a −1st order diffraction light 832, and external light 840 may be refracted into grating coupler 820 and diffracted by second slanted grating 824 into a −1st order diffraction light 842. Point A and point B may be in phase. Therefore, the phase difference between diffraction light 832 and diffraction light 842 may be approximated by:

$$2\pi \frac{OPL_{AC} - OPL_{BC}}{\lambda_0} + \Delta,$$

where $OPL_{AC}$ is the optical path length (physical length multiplied by the refractive index) between point A and point C, $OPL_{BC}$ is the optical path length between point B and point C, $\lambda_0$ is the wavelength of the external light in free space, and Δ is the phase difference caused by the diffraction by first slanted grating 822 and the diffraction by second slanted grating 824. The difference between $OPL_{AC}$ and $OPL_{BC}$ may be fairly small, and thus the phase difference between diffraction light 832 and diffraction light 842 may be close to Δ.

The electrical field of the light diffracted by a grating may be determined using Fourier optics according to, $$o(x) = g(x) \otimes i(x), \text{ or}$$

$$O(f) = G(f) \times I(f),$$

where I(j), G(f), and O(f) are the Fourier transforms of input field i(x), grating function g(x), and output field o(x), respectively, and, and ⊗ is the convolution operator. The Fourier transform of grating function g(x) for first slanted grating 822 may be:

$$F(g(x)) = G(f).$$

The Fourier transform of the grating function for second slanted grating 824 may be:

$$F(g(x-a)) = e^{-i2\pi f a} G(f),$$

where a is the offset of second slanted grating 824 with respect to first slanted grating 822 in the x direction. Because the spatial frequency f of the grating is equal to 1/p, when a is equal to p/2, $e^{-i2\pi f a}$ becomes $e^{-i\pi}$. As such, the electrical field of the light diffracted by first slanted grating 822 and the electrical field of the light diffracted by second slanted grating 824 may be out of phase by about 180° (or π). Therefore, Δ may be equal to about π. Because the optical path difference between $OPL_{AC}$ and $OPL_{BC}$ is fairly small, $$2\pi \frac{OPL_{AC} - OPL_{BC}}{\lambda_0} + \Delta$$

may be close to π and thus may cause at least partial destructive interference between diffraction light 832 and diffraction light 842.

To further reduce the overall −1st order diffraction of external light by grating coupler 820, it is desirable that the phase difference between diffraction light 832 and diffraction light 842 is about 180° (or π), such that diffraction light 832 and diffraction light 842 can destructively interfere to cancel each other. In some embodiments, the height, period, and/or slant angle of grating coupler 820 may be adjusted such that Δ may be different from π, but $$2\pi \frac{OPL_{AC} - OPL_{BC}}{\lambda_0} + \Delta$$

may be approximately equal to π to cause destructive interference between diffraction light 832 and diffraction light 842.

In addition to the symmetrical slanted shape and the high depth, it may also be desirable that the slanted surface-relief grating has a high refractive index modulation, such that a single surface-relief grating on a single waveguide can cover the three primary colors and the full field of view of the waveguide display at a high efficiency. The single plate structure can also reduce weight, improve see-through quality, and reduce optical artifacts of the waveguide display systems. Substrate materials with ultra-high refractive indices for etching the slanted surface-relief gratings may include, for example, $TiO_x$, $LiNbO_3$, $HfO_x$. $TiSiO_x$, $AlO_x$, $TaO_x$, SiC, ZnSe, InGaAs, GaP, and the like.

The slanted grating described above may be fabricated using many different nanofabrication techniques. The nanofabrication techniques generally include a patterning process and a post-patterning (e.g., over-coating) process. The patterning process may be used to form slanted ridges of the slanted grating. There may be many different nanofabrication techniques for forming the slanted ridges. For example, in some implementations, the slanted grating may be fabricated using lithography techniques including slanted etching. In some implementations, the slanted grating may be fabricated using nanoimprint lithography (NIL) molding techniques. The post-patterning process may be used to over-coat the slanted ridges and/or to fill the gaps between the slanted ridges with a material having a different refractive index than the slanted ridges. The post-patterning process may be independent from the patterning process. Thus, a same post-patterning process may be used on slanted gratings fabricated using any pattering technique.

Techniques and processes for fabricating the slanted grating described below are for illustration purposes only and are not intended to be limiting. A person skilled in the art would understand that various modifications may be made to the techniques described below. For example, in some implementations, some operations described below may be omitted. In some implementations, additional operations may be performed to fabricate the slanted grating. Techniques disclosed herein may also be used to fabricate other slanted structures on various materials.

Figure 9A:
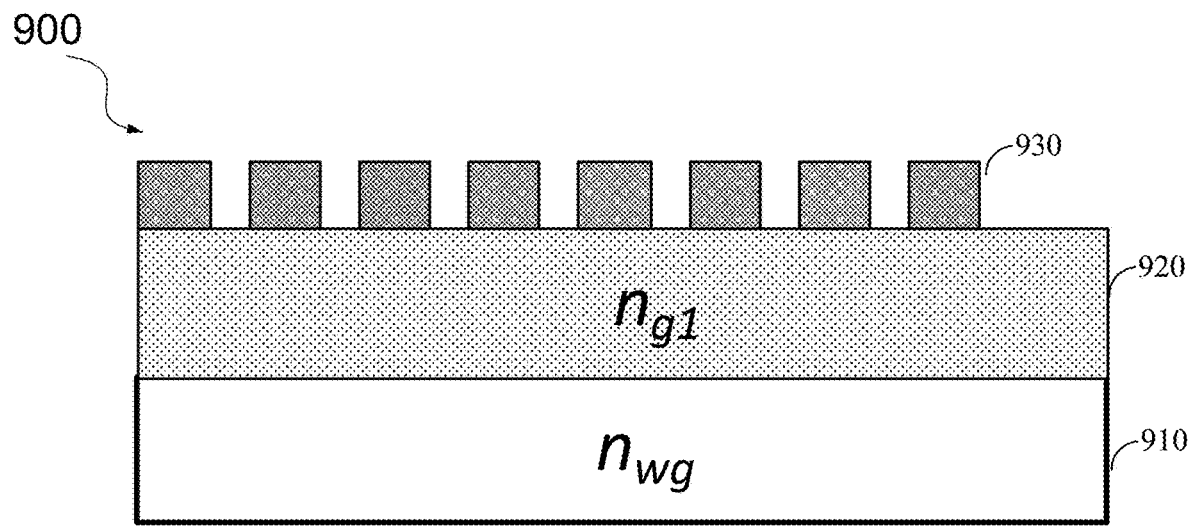
FIGS. 9A-9C illustrate an example process for fabricating a slanted surface-relief structure according to certain embodiments.
Figure 9B:
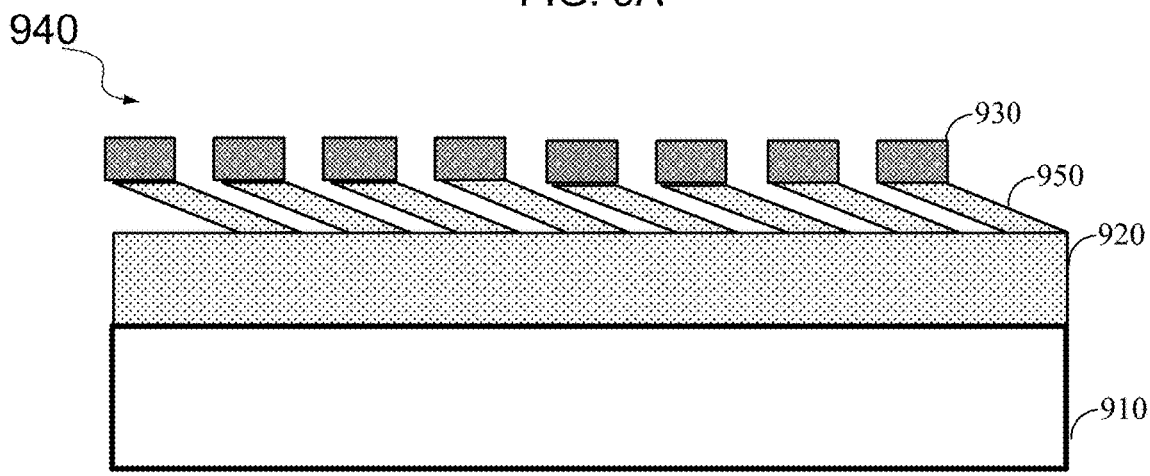
Figure 9C:
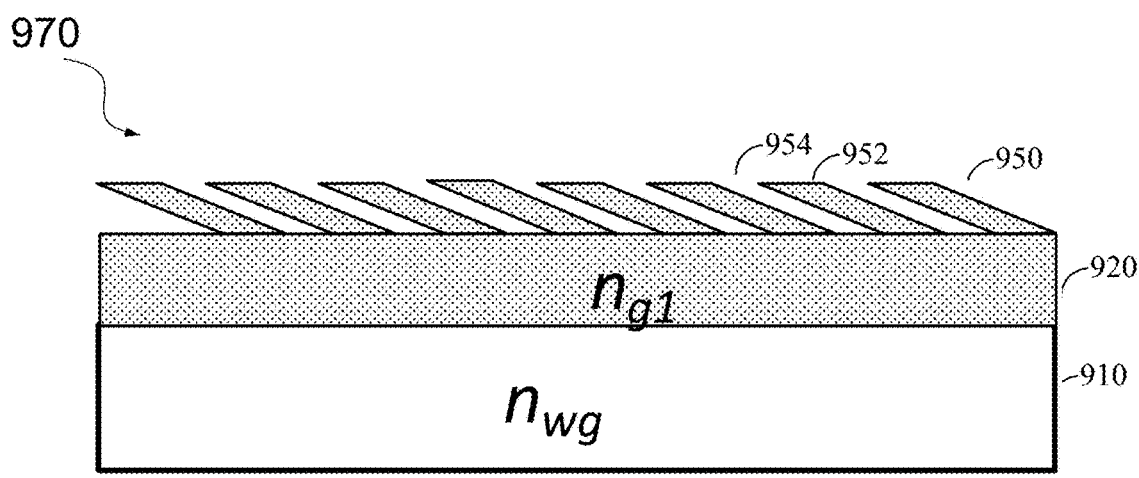

FIGS. 9A-9C illustrate an example simplified process for fabricating a slanted surface-relief grating by slanted etching according to certain embodiments. FIG. 9A shows a structure 900 after a lithography process, such as a photolithography process. Structure 900 may include a substrate 910 that may be used as the waveguide of a waveguide display described above, such as a glass or quartz substrate. Structure 900 may also include a layer of grating material 920, such as $Si_3N_4$, $SiO_2$, $TiO_x$, $LiNbO_3$, $HfO_x$, $TiSiO_x$, $AlO_x$, $TaO_x$, SiC, ZnSe, InGaAs, GaP, or any other grating materials described herein. Substrate 910 may have a refractive index $n_wg$, and the layer of grating material 920 may have a refractive index $n_{g1}$. In some embodiments, the layer of grating material 920 may be a part of substrate 910. A mask layer 930 with a desired pattern may be formed on the layer of grating material 920. Mask layer 930 may include, for example, a photoresist material, a metal (e.g., copper, chrome, titanium, aluminum, or molybdenum), an intermetallic compound (e.g., MoSiON), or a polymer. Mask layer 930 may be formed by, for example, the optical projection or electron beam lithography process, NIL process, or multi-beam interference process.

FIG. 9B shows a structure 940 after a slanted etching process, such as a dry etching process (e.g., reactive ion etching (RIE), inductively coupled plasma (ICP), deep silicon etching (DSE), ion beam etching (IBE), or variations of IBE). The slanted etching process may include one or more sub-steps. The slanted etching may be performed by, for example, rotating structure 900 and etching the layer of grating material 920 by the etching beam based on the desired slant angle. After the etching, a slanted grating 950 may be formed in the layer of grating material 920.

FIG. 9C shows a structure 970 after mask layer 930 is removed. Structure 970 may include substrate 910, the layer of grating material 920, and slanted grating 950. Slanted grating 950 may include a plurality of ridges 952 and grooves 954. Techniques such as plasma or wet etching may be used to strip mask layer 930 with appropriate chemistry. In some implementations, mask layer 930 may not be removed and may be used as part of the slanted grating.

Subsequently, in some implementations, the post-patterning (e.g., over-coating) process may be performed to over-coat slanted grating 950 with a material having a refractive index higher or lower than the material of ridges 952. For example, as described above, in some embodiments, a high refractive index material, such as Hafinia, Titania, Tungsten oxide, Zirconium oxide, Gallium sulfide, Gallium nitride, Gallium phosphide, silicon, and a high refractive index polymer, may be used for the over-coating. In some embodiments, a low refractive index material, such as silicon oxide, alumina, porous silica, or fluorinated low index monomer (or polymer), may be used for the over-coating. As a result, the difference between the refractive index of the ridges and the refractive index of the grooves may be greater than 0.1, 0.2, 0.3, 0.5, 1.0, or higher.

Figure 10:
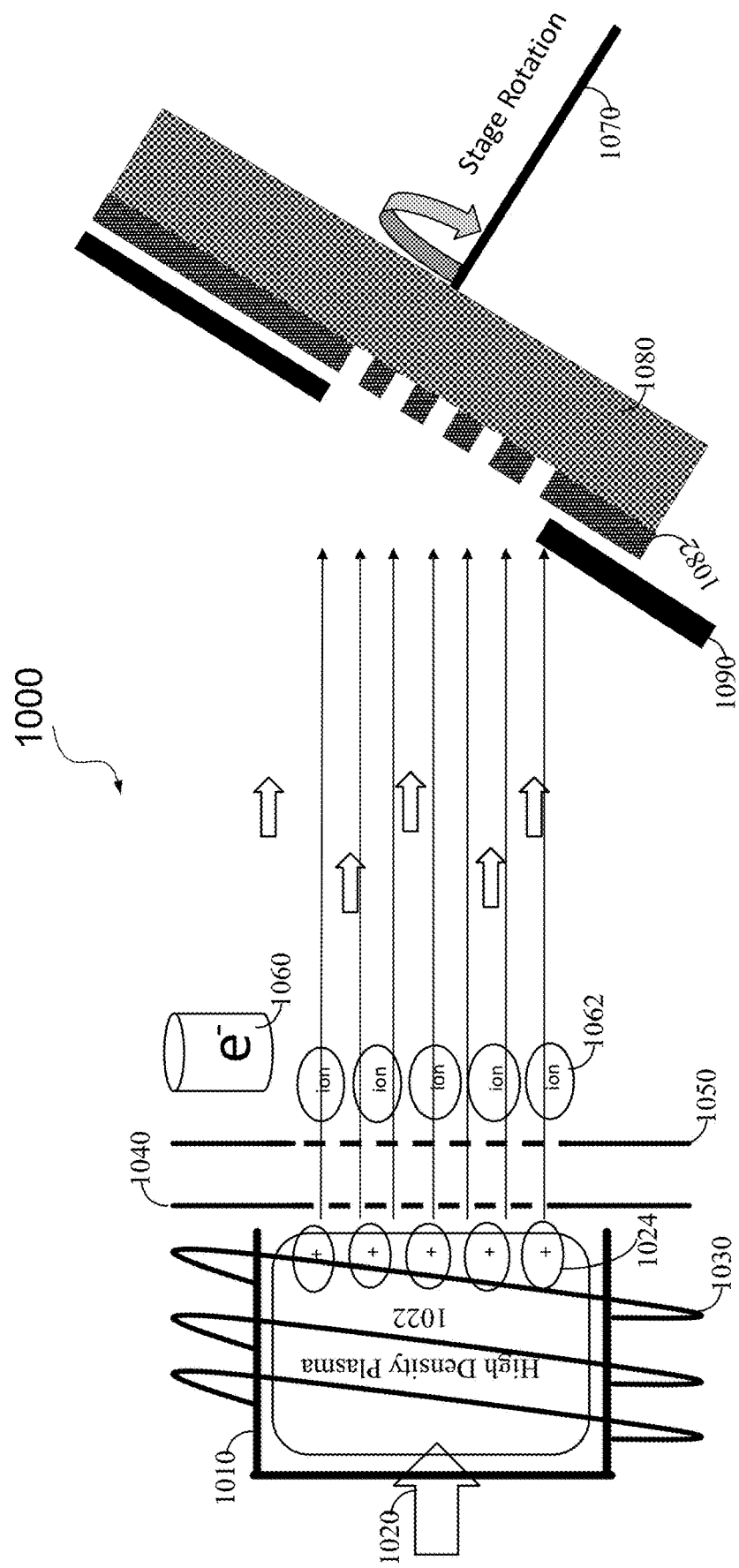
FIG. 10 illustrates an example ion beam etching system for fabricating a slanted surface-relief structure.

FIG. 10 illustrates an example ion beam etching (IBE) system 1000 for fabricating a slanted surface-relief structure. Ion beam etching is one process enabler in surface relief grating fabrication. Ion beam etching generally uses a highly collimated and highly directional ion beam to physically mill materials from a substrate mounted on a rotation stage with an adjustable rotation angle.

IBE system 1000 may include an ion source generator 1010. Ion source generator 1010 may include an inert gas inlet 1020 for receiving an inert gas, such as an Argon gas, into a chamber of ion source generator 1010. A plasma may be generated in ion source generator 1010 via an RF inductively coupled plasma (ICP) generator 1030, where highly energetic electrons may ionize neutrals of the injected inert gas (e.g., Ar) through collisions with the neutrals. A high density plasma 1022 may be generated within ion source generator 1010 by the impact ionization. High density plasma 1022 may be considered as a sea of neutrals with positive ions 1024 and negative electrons in charge equilibrium.

IBE system 1000 may also include one or more aligned collimator grids for extracting a collimated ion beam 1062 from high density plasma 1022 formed within ion source generator 1010. The aligned collimator grids may be implemented in various ways. For example, as shown in FIG. 10, the aligned collimator grids may include an extraction grid 1040 that may contact high density plasma 1022 and control its potential, and an acceleration grid 1050 that may be driven by an adjustable negative high voltage supply for accelerating the extracted ions. A beam neutralizer 1060 may be disposed near the aligned collimator grids and may emit an electron beam into collimated ion beam 1062 to achieve a net neutral charge flux associated with collimated ion beam 1062 in order to prevent the buildup of positive charges on the structure to be etched.

The highly directional collimated ion beam 1062 may physically mill materials from a material layer 1080 to be etched, such as, for example, a semiconductor wafer, a glass substrate, a $Si_3N_4$ material layer, a titanium oxide layer, an alumina layer, etc. Material layer 1080 may be partially covered by a mask 1082, which may be formed on material layer 1080 by, for example, a photolithography process. Mask 1082 may include, for example, a photoresist material, a metal (e.g., copper, chrome, aluminum, or molybdenum), an intermetallic compound (e.g., $MoSi_2$), or a polymer. In some embodiments, a shutter 1090 (or blade) may be used to control the etch time and/or the etch region. Material layer 1080 may be mounted on a rotation stage 1070 that can be rotated to modify the angle of material layer 1080 with respect to the highly directional collimated ion beam 1062. The ability to modify the angle of material layer 1080 may allow for the creation of tailored sidewall profiles with minimal sputtered redeposition on mask 1082. Since the IBE mechanism is purely physical, the etch rate may not be as fast as desired. In addition, the energetic ions may cause stoichiometric damage to the material layer and introduce defects, and thus may lead to degraded performance of the etched slanted structure.

Figure 11:
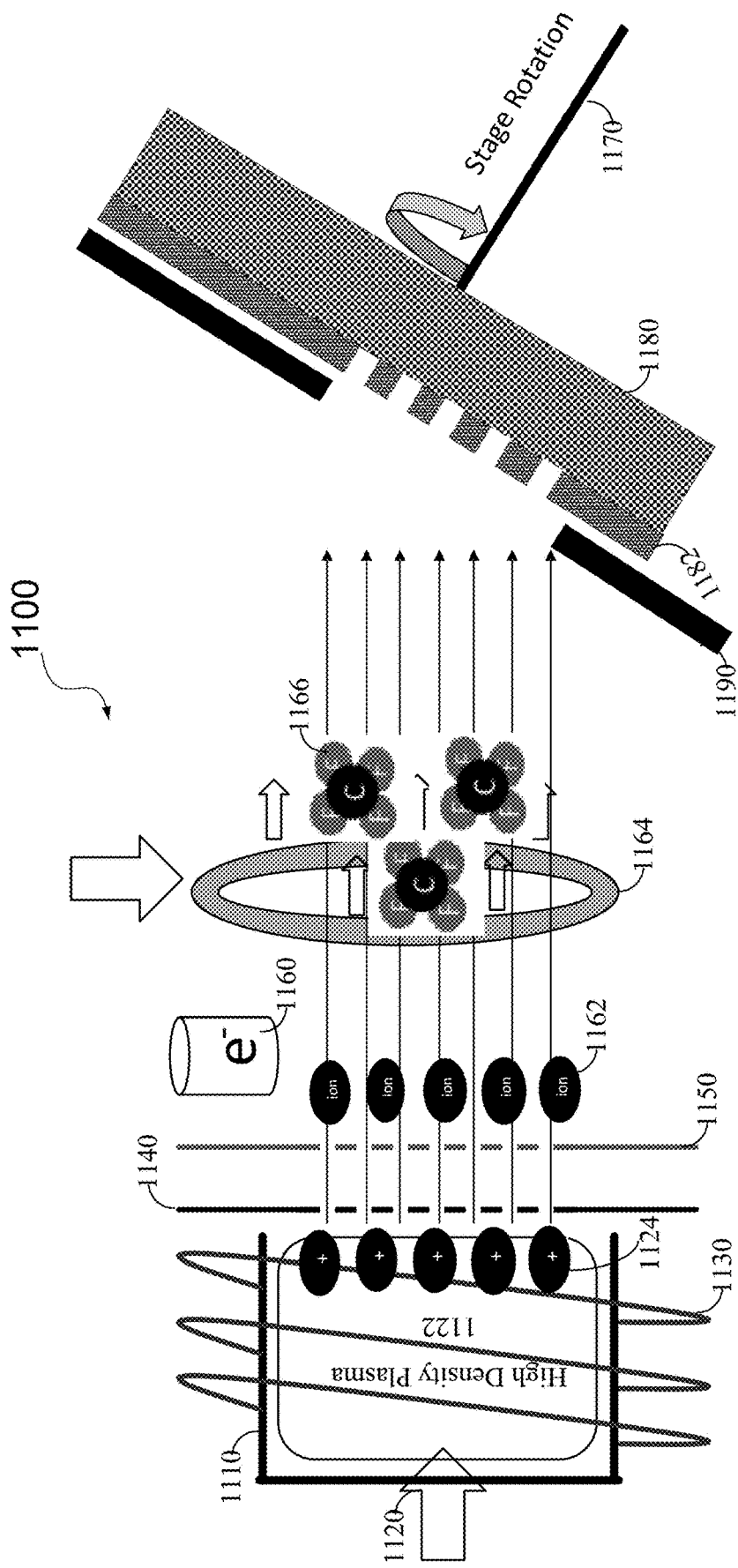
FIG. 11 illustrates an example chemically assisted ion beam etching (CAIBE) system for fabricating a slanted surface-relief structure.

FIG. 11 illustrates an example chemically assisted ion beam etching (CAIBE) system 1100 for fabricating a slanted surface-relief structure. In the chemically assisted ion beam etching, reactive species, such as a reactive gas (e.g., $CF_4$, $CHF_3$, $N_2$, $O_2$, $SF_6$, $Cl_2$, $BCl_3$, HBr, etc.) may be introduced into the process independent of the ion beam. Thus, the material layer to be etched may be etched both physically and chemically.

As IBE system 1000, CAIBE system 1100 may include an ion source generator 1110. Ion source generator 1110 may be similar to ion source generator 1010 described above with respect to FIG. 10. Ion source generator 1110 may include an inert gas inlet 1120 for receiving an inert gas, such as an Argon gas, into a chamber of ion source generator 1110. A plasma may be generated in ion source generator 1110 via an RF inductively coupled plasma (ICP) generator 1130. A high density plasma 1122 may be generated within ion source generator 1110 by impact ionization. One or more aligned collimator grids may be used to extract a collimated ion beam 1162 from high density plasma 1122. For example, as shown in FIG. 11, the aligned collimator grids may include an extraction grid 1140 that may contact high density plasma 1122 and control its potential, and an acceleration grid 1150 that may be driven by an adjustable negative high voltage supply for accelerating the extracted ions. A beam neutralizer 1160 may be disposed near the aligned collimator grids and may emit an electron beam into collimated ion beam 1162 to achieve a net neutral charge flux associated with collimated ion beam 1162 in order to prevent the buildup of positive charges on the structure to be etched.

In addition, an reactive gas 1166 (e.g., $CF_4$, $CHF_3$, $N_2$, $O_2$, $SF_6$, $Cl_2$, $BCl_3$, HBr, etc.) may be injected onto a material layer 1180 to be etched using a gas ring 1164. In general, reactive gas 1166 may be injected at a location close to material layer 1180. Reactive gas and collimated ion beam 1162 may reach areas of material layer 1180 uncovered by a mask 1182, and both physically (as in IBE) and chemically etch the uncovered area. For example, a glass substrate may be chemically etched by a reactive gas $CF_4$ according to:

$$SiO_2 + CF_4 \rightarrow SiF_4 + CO_2.$$

$SiF_4$ and $CO_2$ are volatile materials that may be easily removed. As IBE system 1000, CAIBE system 1100 may include a shutter 1190 (or blade) for controlling the etch time and/or the etch region. Material layer 1180 may be mounted on a rotation stage 1170 that can be rotated to modify the angle of material layer 1180 with respect to the highly directional collimated ion beam 1162. For certain materials, an CAIBE system may offer additional control of etch anisotropy, sputter redeposition, and etch rate over an IBE system.

Figure 12:
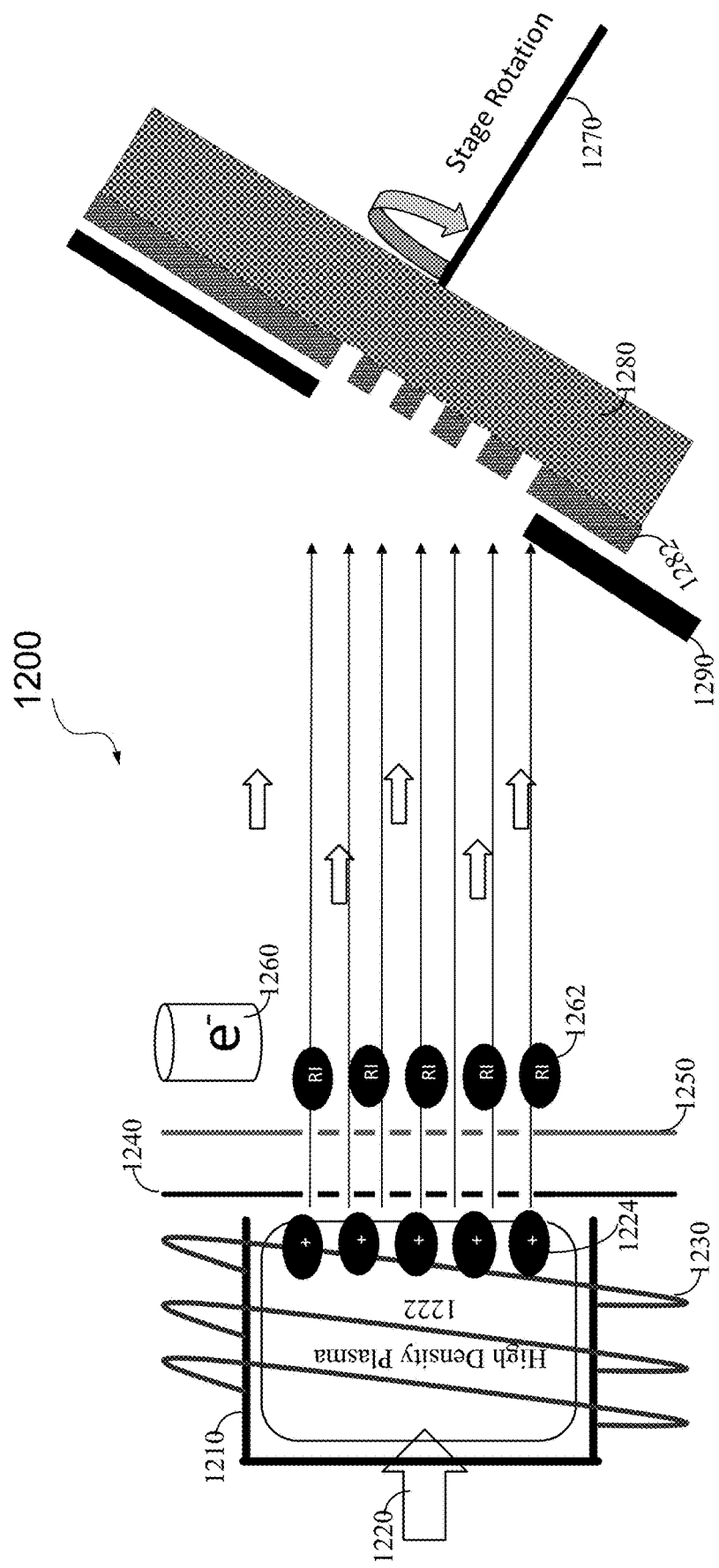
FIG. 12 illustrates an example reactive ion beam etching (RIBE) system for fabricating a slanted surface-relief structure.

FIG. 12 illustrates an example reactive ion beam etching (RIBE) system 1200 for fabricating a slanted surface-relief structure. Reactive ion beam etching system 1200 may be similar to IBE system 1000, except that a reactive gas (e.g., $CF_4$, $CHF_3$, $N_2$, $O_2$, $SF_6$, $Cl_2$, $BCl_3$, HBr, etc.) may also be injected into the ion source generator to form a reactive ion beam that can both physically and chemically etch the material layer to be etched.

RIBE system 1200 may be similar to IBE system 1000, and may include an ion source generator 1210 for generating a high density plasma 1222. Ion source generator 1210 may include an gas inlet 1220 for receiving a reactive gas (e.g., $CF_4$, $CHF_3$, $N_2$, $O_2$, $SF_6$, $Cl_2$, $BCl_3$, or HBr, etc.) and, in some cases, an inert gas (e.g., Argon gas, Helium gas, or Neon gas) into a chamber of ion source generator 1210. High density plasma 1222 may be generated by impact ionization in ion source generator 1210 via an RF inductively coupled plasma (ICP) generator 1230. One or more aligned collimator grids may be used to extract a collimated reactive ion beam 1262 from high density plasma 1222. For example, as shown in FIG. 12, the aligned collimator grids may include an extraction grid 1240 that may contact high density plasma 1222 and control its potential, and an acceleration grid 1250 that may be driven by an adjustable negative high voltage supply for accelerating the extracted reactive ions. A beam neutralizer 1260 may be disposed near the aligned collimator grids and may emit an electron beam into collimated reactive ion beam 1262 to achieve a net neutral charge flux associated with collimated reactive ion beam 1262 in order to prevent the buildup of positive charges on the structure to be etched.

Collimated reactive ion beam 1262 may reach areas of a material layer 1280 uncovered by a mask 1282, and physically and chemically etched the uncovered area. As IBE system 1000 and CAIBE system 1100, RIBE system 1200 may also include a shutter 1290 (or blade) for controlling the etch time and/or the etch region. Material layer 1280 may be mounted on a rotation stage 1270 that can be rotated to modify the angle of material layer 1280 with respect to the highly directional collimated reactive ion beam 1262. For certain materials, an RIBE system may offer additional control of etch anisotropy, sputter redeposition, and etch rate over an IBE system.

For many materials (e.g., silicon nitride, organic materials, or inorganic metal oxides) and/or certain desired slanted features (e.g., grating ridge with substantially equal leading edge and trailing edge), these known etching processes, such as the IBE process, RIBE process, and CAIBE process, may not be used to reliably fabricate the slanted structures. One reason is that these processes may not provide appropriate combinations of reactants and/or process parameters for etching the desired slanted structures on the desired materials. According to certain embodiments, a chemically assisted reactive ion beam etch (CARIBE) process can be used to fabricate slanted surface-relief structures on various materials. The CARIBE process disclosed herein may provide more effective control of radicals and ions by providing appropriate chemical components in the ion source and the gas ring, and thus may enable improved profile and mask selectivity for materials requiring a higher amount of chemical component for etching and may also help in increasing the etch stop margin. Using the CARIBE process, the features of the slanted structure can be more accurately fabricated on various materials, including materials that may need a higher amount of chemical components. In some embodiments, the process described herein may be used to fabricate a grating on an object that controls the behavior of light as the light reflects, refracts, and/or diffracts due to the interactions with the gratings and/or the interferences between light that interacts with the gratings. In some embodiments, the grating may be slanted and the object may be an optical element, such as a waveguide for waveguide display.

Figure 13:
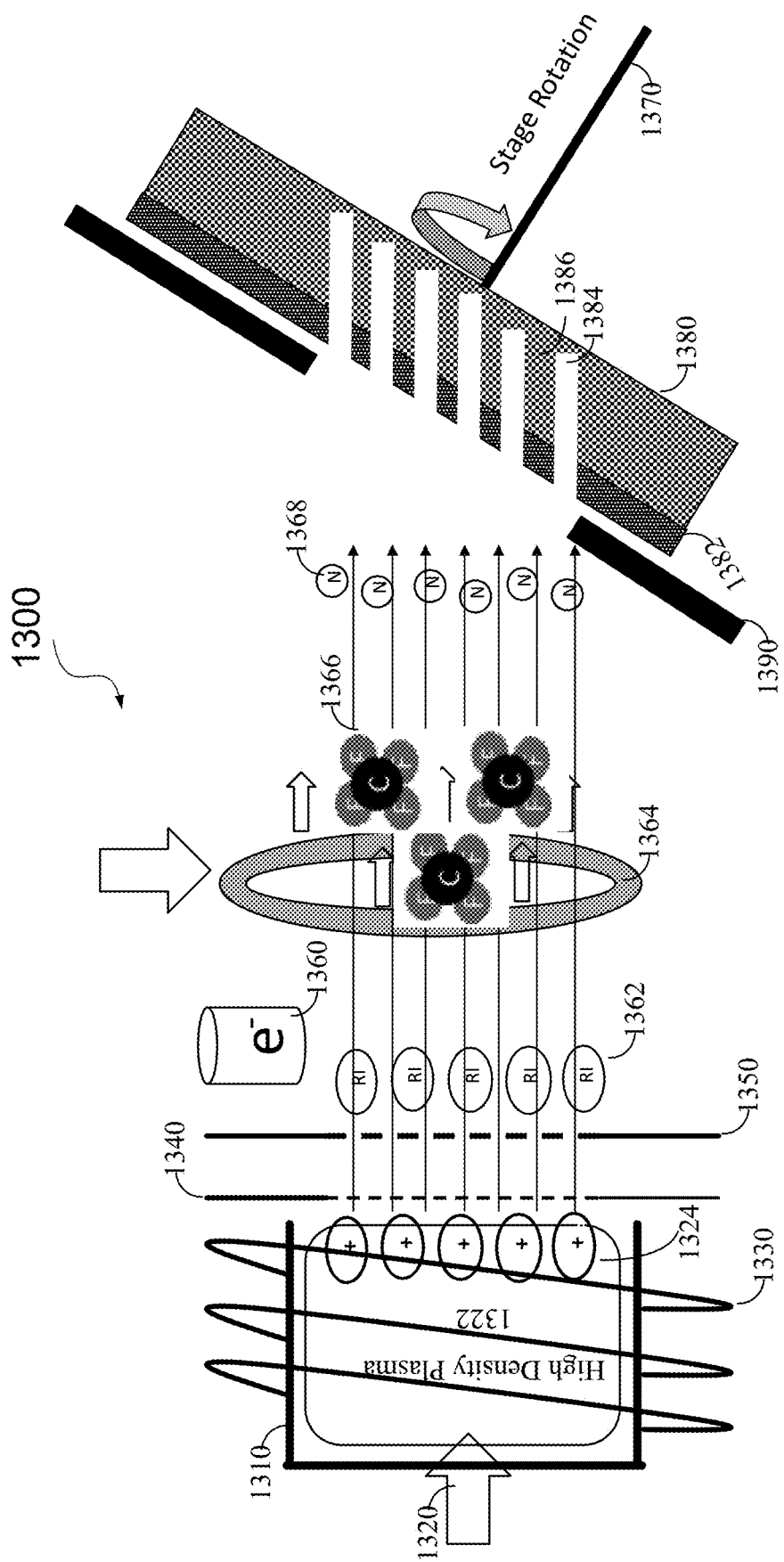
FIG. 13 illustrates an example chemically assisted reactive ion beam etching (CARIBE) system for fabricating a slanted surface-relief structure according to certain embodiments.

FIG. 13 illustrates an example chemically assisted reactive ion beam etching (CARIBE) system 1300 for fabricating a slanted surface-relief structure according to certain embodiments. CARIBE system 1300 may include a reactive ion source generator 1310. Reactive ion source generator 1310 may include an gas inlet 1320 for receiving a reactive gas (e.g., $CF_4$, $CHF_3$, $N_2$, $O_2$, $SF_6$, $H_2$, $Cl_2$, $BCl_3$, HBr, etc.)

and, in some cases, an inert gas (e.g., Argon gas) into a chamber of reactive ion source generator 1310. A high density plasma 1322 may be generated by impact ionization in reactive ion source generator 1310 via an RF inductively coupled plasma (ICP) generator 1330. One or more aligned collimator grids may be used to extract a collimated reactive ion beam 1362 from high density plasma 1322. For example, as shown in FIG. 13, the aligned collimator grids may include an extraction grid 1340 that may contact high density plasma 1322 and control its potential, and an acceleration grid 1350 that may be driven by an adjustable negative high voltage supply for accelerating the extracted reactive ions. A beam neutralizer 1360 may be disposed near the aligned collimator grids and may emit an electron beam into collimated reactive ion beam 1362 to achieve a net neutral charge flux associated with collimated reactive ion beam 1362 in order to prevent the buildup of positive charges on the structure to be etched.

In addition, CARIBE system 1300 may include a gas ring 1364 for injecting an reactive gas 1366 (e.g., $CF_4$, $NF_3$, $CHF_3$, $N_2$, $O_2$, $SF_6$, $Cl_2$, $BCl_3$, HBr, etc.) onto the material layer to be etched at a location close to the material layer. Collimated reactive ion beam 1362 (or neutrals 1368 after neutralization) and reactive gas 1366 may reach areas of a material layer 1380 uncovered by a mask 1382, and may physically and chemically etched the uncovered area due to physical milling and chemical reactions. For example, a $Si_3N_4$ layer may be chemically etched by a reactive gas $CF_4$ according to:

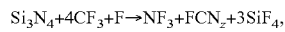

$$Si_3N_4 + 4CF_3 + F \rightarrow NF_3 + FCN_2 + 3SiF_4,$$

where the $NF_3$, $FCN_z$, and $SiF_4$ may be volatile material and can be relatively easily removed to form the slanted structures in the $SbN_4$ layer. The neutral to ion ratio in the beam that reaches material layer 1380 in the CARIBE process may be higher than that in the RIBE or CAIBE process.

CARIBE system 1300 may include a shutter 1390 (or blade) for controlling the etch time and/or the etch region. Material layer 1380 may be mounted on a rotation stage 1370 that can be rotated to modify the angle of material layer 1380 with respect to the highly directional collimated reactive ion beam 1362. As a result, a slanted structure including a plurality of grooves 1384 and a plurality of ridges 1386 may be formed in material layer 1380. The width and the slant angle of ridges 1386 may be more precisely controlled, compare with the IBE, RIBE, or CAIBE process.

In general, the ion source generator used in semiconductor etching, such as an inductive coupled plasma (ICP) chamber, may include an internal cavity layer made with quartz. When certain gases, such as a hydrogen gas, is added in the ion source generator, certain ions, such as hydrogen ions, generated in the chamber may enter and/or react with the quartz layer and change the physical and/or chemical properties of the quartz layer, which may cause damage to the quartz layer. According to certain embodiments, the quartz layer in the ion source generator may be replaced with oxide materials, such as aluminum oxide ($Al_2O_3$) or $Y_2O_3$, in order to use in select etching processes, such as hydrogen-based or hydrogen-assisted ion beam etching described herein.

Figure 14:
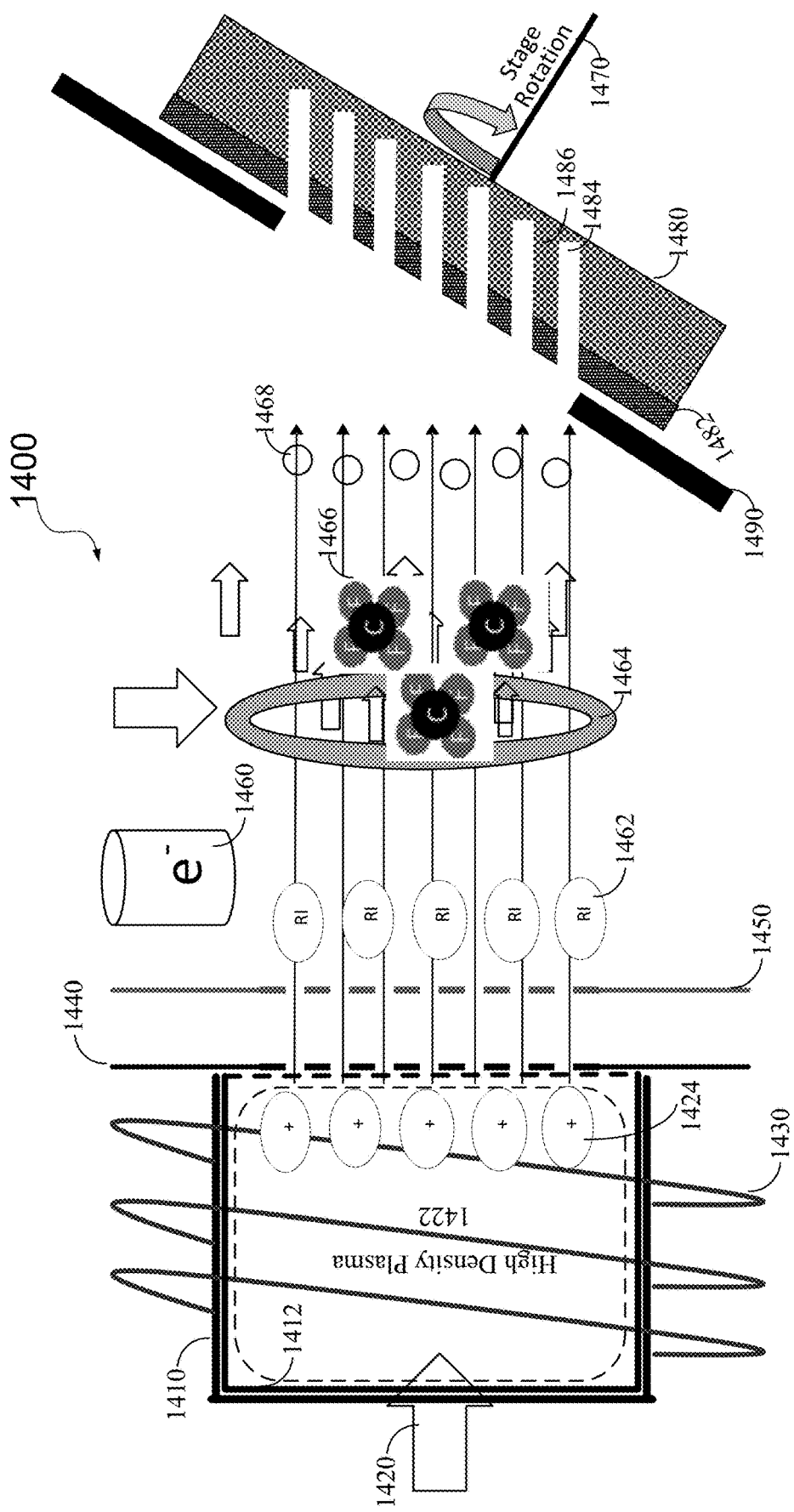
FIG. 14 illustrates a further example of a CARIBE system for fabricating a slanted surface-relief structure according to certain embodiments.

FIG. 14 illustrates a further example of chemically assisted reactive ion beam etching (CARIBE) system 1400 for fabricating a slanted surface-relief structure according to certain embodiments. CARIBE system 1400 may include an ion source generator 1410, such as a reactive ion source generator, which may be similar to ion source generator 1010, 1110, 1210, or 1310. Ion source generator 1410 may include an inert gas inlet 1420 for receiving gases, such as certain combinations of $H_2$, $N_2$, $NF_3$, NEB, CEE, $CHF_3$, $CF_4$, $CH_2F_2$, $CH_3F$, $C_4F_8$, $C_4F_6$, $C_2F_6$, $C_2F_8$, $SF_6$, $CLF_3$, $N_2O$, $O_2$, $SO_2$, COS, He, $Cl_2$, HBr, $BCl_3$, or the like, into a chamber of ion source generator 1410. A plasma may be generated in ion source generator 1410 via an RF inductively coupled plasma (ICP) generator 1430, where highly energetic electrons may ionize neutrals of the injected inert gases (e.g., a hydrogen-containing or hydrogen-based gas species, or a nitrogen-containing or nitrogen-based gas species) through collisions with the neutrals. A high density plasma 1422 may be generated within ion source generator 1410 by the impact ionization. High density plasma 1422 may include positive ions 1424 and negative electrons in charge equilibrium.

The surface layer 1412 of the internal cavity of ion source generator 1410 may include a layer of an oxide material, such as aluminum oxide ($Al_2O_3$) or yttrium oxide ($Y_2O_3$), such that the hydrogen ions generated in the chamber may not enter or may not react with surface layer 1412 and change the physical and/or chemical properties of surface layer 1412. Thus, surface layer 1412 may not be damaged by the ions generated inside the cavity.

CARIBE system 1400 may also include one or more aligned collimator grids for extracting a collimated reactive ion beam 1462 from high density plasma 1422 formed within ion source generator 1410. The aligned collimator grids may be implemented in various ways. For example, as shown in FIG. 14, the aligned collimator grids may include an extraction grid 1440 that may control the potential of high density plasma 1422, and an acceleration grid 1450 that may be driven by an adjustable (negative or positive) high voltage supply for accelerating the extracted ions. A beam neutralizer 1460 may optionally be positioned near the aligned collimator grids. Beam neutralizer 1460 may emit an electron beam into collimated reactive ion beam 1462 to achieve a net neutral charge flux associated with collimated reactive ion beam 1462 in order to prevent the buildup of positive charges on the structure to be etched.

CARIBE system 1400 may further include a gas ring 1464 for injecting an reactive gas 1466 (e.g., $CF_4$, $NF_3$, $SF_6$, $CHF_3$, $N_2$, $O_2$, $Cl_2$, HBr, $BCl_3$, etc.) onto the material layer to be etched at a location close to the material layer. Collimated reactive ion beam 1462 (and/or neutrals 1468 after neutralization) and reactive gas 1466 may reach areas of a material layer 1480 uncovered by a mask 1482, and may physically and chemically etched the uncovered area due to physical milling and chemical reactions. The neutral to ion ratio in the beam that reaches material layer 1480 in the CARIBE process may be higher than that in the RIBE or CAIBE process.

CARIBE system 1400 may include a shutter 1490 (or blade) for controlling the etch time and/or the etch region. Material layer 1480 may be mounted on a rotation stage 1470 that can be rotated to modify the angle of material layer 1480 with respect to the highly directional collimated reactive ion beam 1462. As a result, a slanted structure including a plurality of grooves 1484 and a plurality of ridges 1486 may be formed in material layer 1480. The width and the slant angle of ridges 1486 may be more precisely controlled, compare with the IBE, RIBE, or CAIBE process.

Figure 15A:
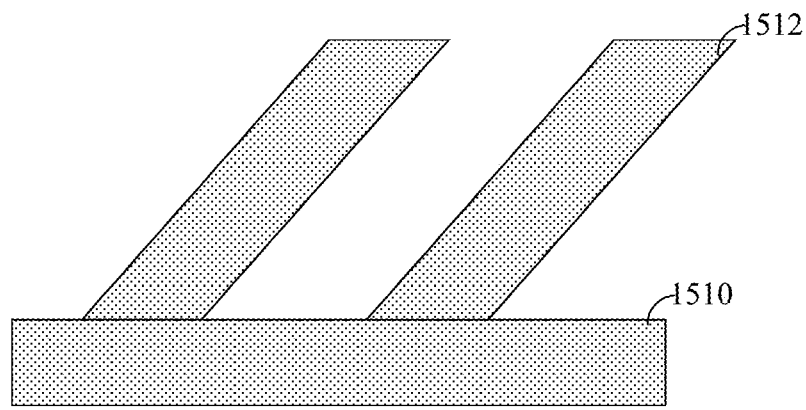
FIG. 15A illustrates an example of a slanted grating on a low-refractive-index substrate according to certain embodiments.

FIG. 15A illustrates an example of a slanted grating 1512 on a low-refractive-index substrate 1510 according to certain embodiments. The low-refractive-index substrate 1510 may be, for example, a quartz substrate that may have a refractive index of about 1.46 to about 1.5. Thus, slanted grating 1512 formed on low-refractive-index substrate 1510 may have a low refractive index. In some embodiments, to achieve a better performance (e.g., high efficiency), a grating with a high refractive index may be needed such that a high-refractive index contrast may be achieved between the grating ridges and grating grooves.

Figure 15B:
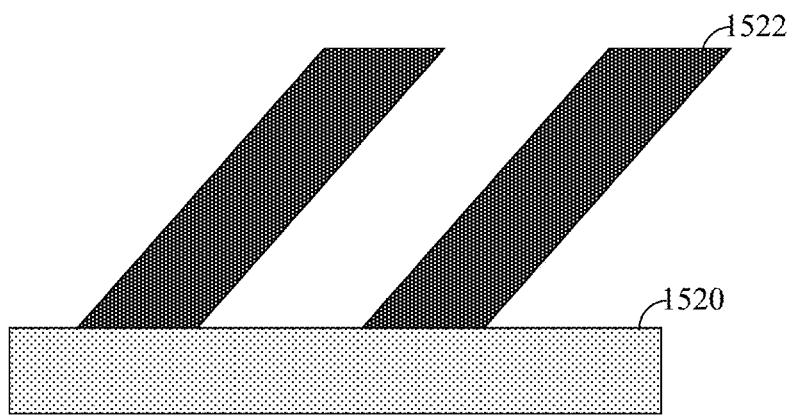
FIG. 15B illustrates an example of a slanted grating fabricated in a high-refractive-index material on a low-refractive-index substrate according to certain embodiments.

FIG. 15B illustrates an example of a slanted grating 1522 fabricated in a high-refractive-index material or ultra-high-refractive-index material (or simply, ultra-high-index material) on a low-refractive-index substrate 1520 according to certain embodiments. The low-refractive-index substrate 1520 may include, for example, a quartz substrate that may have a refractive index of about 1.46 to about 1.5. A layer of high-refractive-index material or ultra-high-index material may be formed (e.g., deposited) on low-refractive-index substrate 1520. Slanted grating 1522 may be etched in the layer of high-refractive-index material or ultra-high-index material. The high-refractive-index material may include, for example, SiON (which may have a refractive index about 1.7) or $Si_3N_4$ (which may have a refractive index of about 2.1). The ultra-high-index material may include, for example, $TiO_x$, $LiNbO_3$, $HfO_x$, $TiSiO_x$, SiC, ZnSe, InGaAs, GaP, or the like, which may have a refractive index of 2.3 or greater (e.g., 2.3, 2.4, 2.5, 2.6, or greater). As such, a relatively high refractive-index contrast may be achieved between the grating ridges and grating grooves.

Figure 15C:
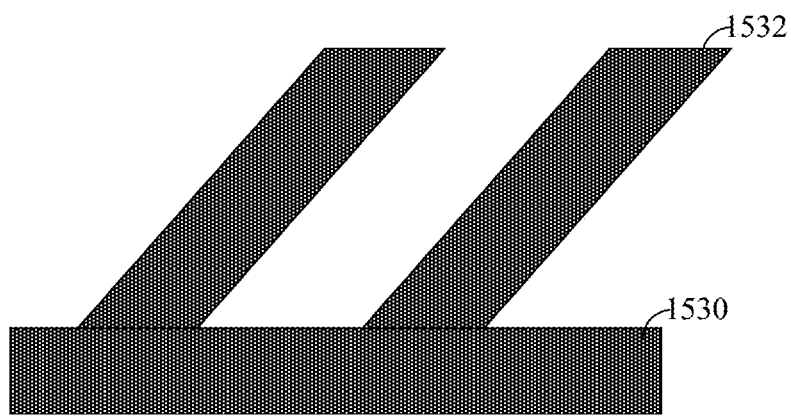
FIG. 15C illustrates an example of a slanted grating on a high-refractive-index substrate according to certain embodiments.

FIG. 15C illustrates an example of a slanted grating 1532 on a high-refractive-index substrate 1530 according to certain embodiments. Slanted grating 1532 and substrate 1530 may be of the same material, such as SiON, $Si_3N_4$, $TiO_x$, $LiNbO_3$, $HfO_x$, $TiSiO_x$, SiC, ZnSe, InGaAs, GaP, and the like, and may have the same high refractive index. As such, a relatively high-refractive index contrast may be achieved between the grating ridges and grating grooves.

As described above, using gratings etched in a material having a high or ultra-high refractive index (e.g., $TiO_x$, $LiNbO_3$, $HfO_x$, $TiSiO_x$, SiC, ZnSe, InGaAs, GaP, and the like), a single surface-relief grating that may diffract light of three primary colors and from the full field of view with high efficiency may be obtained. However, it is challenging to more efficiently and more accurately fabricate, on the ultra-high-index materials, surface-relief gratings that have a large depth, large slanted angle, and/or a high symmetry between the leading edge and the trailing edge of the grating ridges. For example, using some existing techniques, the etch rate may be low, a large slant angle (e.g., >45°) or grating depth (e.g., >100 nm) may not be achieved, the slant angle of the leading edges and the slant angle of the trailing edges of the grating ridges may be very different, the length of the leading edges and the length of the trailing edges of the grating ridges may be very different, and the etch rate may be low.

Figure 16A:
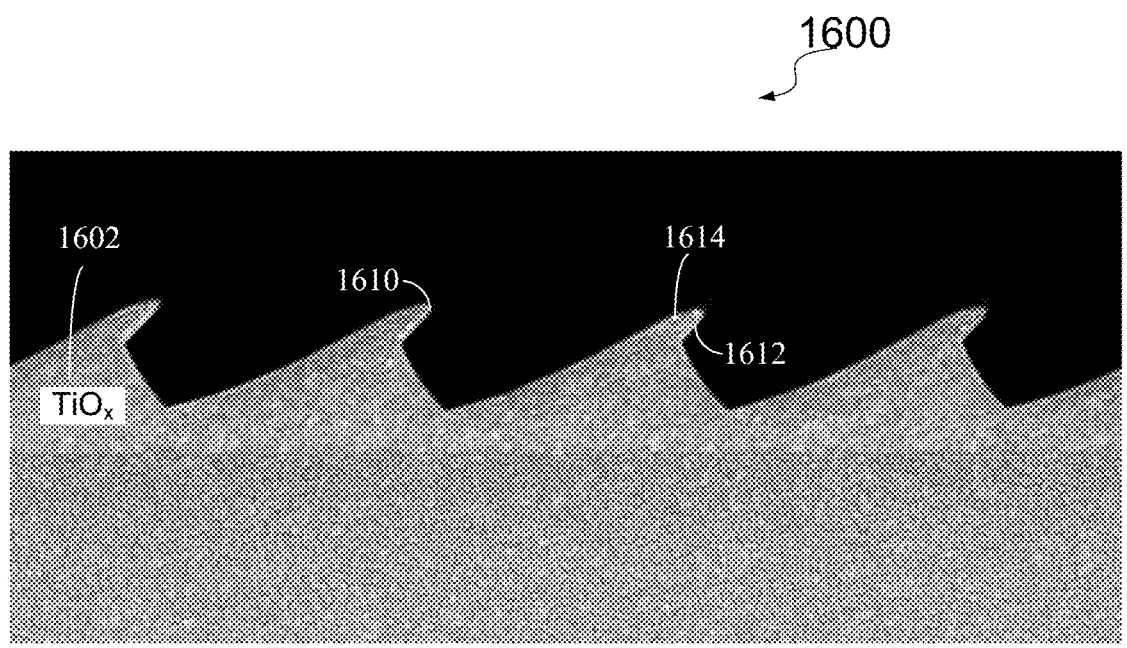
FIG. 16A illustrates an example of a slanted grating fabricated on a high-index material layer using an existing process.

FIG. 16A illustrates an example of a slanted grating 1600 fabricated using an existing process. Slanted grating 1600 may be fabricated on an ultra-high-index material layer 1602, such as a $TiO_x$ material layer. The refractive index of ultra-high-index material layer 1602 may be greater than or about 2.3. As described above, in many applications according to certain embodiments, in order to achieve certain desired performance, it is often desirable that the leading edge and the trailing edge of a ridge of the slanted grating are substantially parallel to each other, and/or the leading edge and the trailing edge of the ridge have similar lengths. As shown in FIG. 16A, however, the slant angle of a leading edge 1612 of a ridge 1610 of slanted grating 1600 may be very different from the slant angle of a trailing edge 1614 of ridge 1610 of slanted grating 1600. Further, the length of leading edge 1612 of ridge 1610 of slanted grating 1600 may be very different from the length of trailing edge 1614 of ridge 1610 of slanted grating 1600. The depth of slanted grating 1600 may also be very small.

Figure 16B:
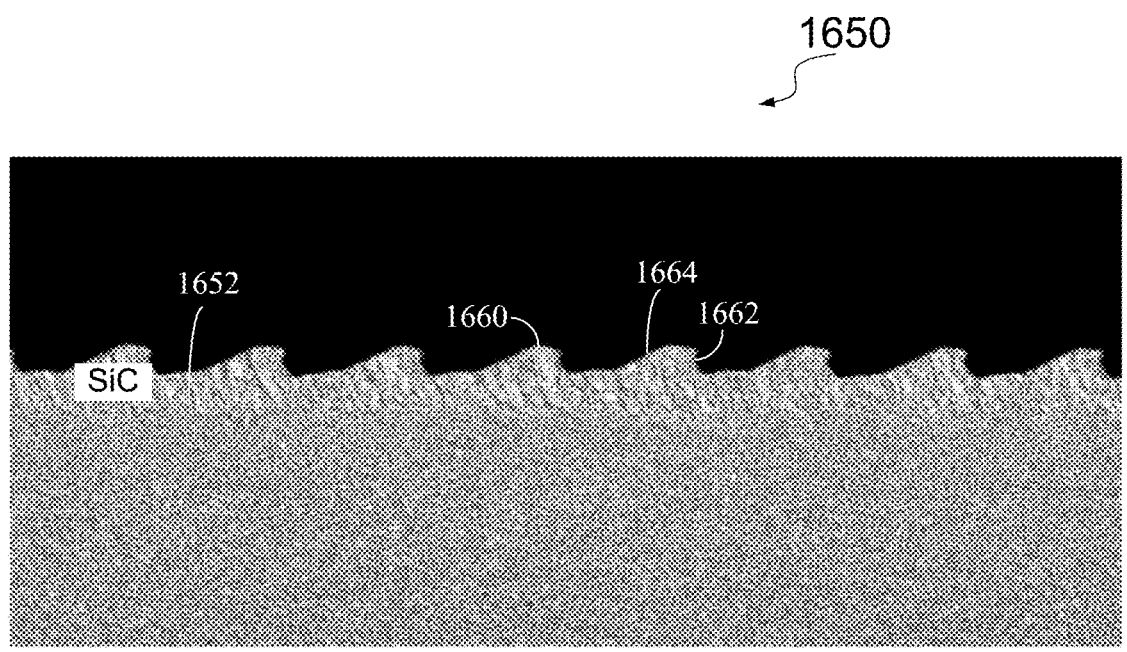
FIG. 16B illustrates a further example slanted grating fabricated on a high-index material layer using an existing process.

FIG. 16B illustrates another example of a slanted grating 1650 fabricated using an existing process. Slanted grating 1650 may be fabricated on an ultra-high-index material layer 1652, such as a SiC material layer. The refractive index of ultra-high-index material layer 1602 may be greater than or about 2.3. Similar to slanted grating 1600, the slant angle of a leading edge 1662 of a ridge 1660 of slanted grating 1650 may be very different from the slant angle of a trailing edge 1614 of ridge 1660 of slanted grating 1650, as shown in FIG. 16B. Additionally, the length of leading edge 1662 of ridge 1610 of slanted grating 1600 may be very different from the length of trailing edge 1664 of ridge 1610 of slanted grating 1600. The slanted grating 1650 may be very shallow.

The small depths of slanted grating 1600 and slanted grating 1650 and the large difference between the slant angles and the lengths of the leading and trailing edges as shown in slanted grating 1600 and slanted grating 1650 may be caused by low etch rates of the ultra-high-index materials by the etch chemistry of existing processes and/or the accumulation of certain etched materials (e.g., carbon or other residues) generated during the etching processes. Therefore, slanted gratings fabricated in ultra-high-index materials using existing processes may not have the desired features and thus may not achieve the desired performance for certain applications.

According to some embodiments, a CARIBE process may be implemented to more efficiently and/or accurately fabricate slanted gratings. In some embodiments, an ion beam containing hydrogen and nitrogen ions may be generated using the ion source generator. Without intending to be bound to any particular theory, the hydrogen and nitrogen ions in the ions beam may dope and break bonds in the ultra-high-index materials to be etched (e.g., $TiO_x$, $LiNbO_3$, $HfO_x$, $TiSiO_x$, SiC, ZnSe, InGaAs, GaP, etc.), thus facilitating the etching and removing of the ultra-high-index materials. For example, nitrogen ions or atoms, due to their relatively heavy mass and thus high kinetic energy, may break some bonds that may not otherwise be broken by lighter ions (e.g., hydrogen ions) such that the material may be more easily etched. In additions, nitrogen may not react with Si, Ti, Hf, or the like, to form non-volatile oxides.

Hydrogen ions or atoms, due to their small sizes, may penetrate deeper into the ultra-high-index material layer to disrupt the crystal structure and/or chemical bonds in the ultra-high-index material layer. The breaking of some bonds by the nitrogen may facilitate the penetration of hydrogen into the ultra-high-index material layer. Although nitrogen may not form volatile compounds with Si, Ti, Hf, or the like, the hydrogen and/or nitrogen doped ultra-high-index materials may react with reactive gases, such as a fluorine-based reactive gas, chlorine-based reactive gas, or bromine-based reactive gas, to form volatile materials that may be easily removed. The fluorine-based, chlorine-based, or bromine-based reactive gas may be added to the ion source generator and/or may be applied on the ultra-high-index materials to be etched via the gas ring to react with the hydrogen and/or nitrogen doped ultra-high-index materials to form volatile materials. In this way, symmetric and/or deep slanted gratings may be more efficiently etched in materials with ultra-high refractive indices, such as greater than about 2.3 (e.g., 2.3, 2.4, 2.5, 2.6, or greater). In addition, temperature of the substrate could be used as a knob to further control the etching process.

According to some embodiments, hydrogen and nitrogen ions may be generated by adding one or more of $H_2$, $N_2$, $NF_3$, $NH_3$, $CH_4$, $CHF_3$, HBr, and the like to the ion source generator. The fluorine-based reactive gas may include one or more of $CF_4$, $NF_3$, $SF_6$, and the like. The chlorine-based reactive gas may include one or more of $Cl_2$, $BCl_3$ and the like. The bromine-based reactive gas may include one or more of HBr and the like. The reactive ion beam including hydrogen and nitrogen and the reactive gas may reach areas of the ultra-high-index material layer uncovered by an etch mask (e.g., mask 1482), and may both physically and chemically etched the uncovered area due to physical milling and/or chemical reactions. For example, uncovered areas of a SiC material layer may be converted to $Si_wH_xN_yC_zF$, $Si_wH_xN_yC_zCl$, or $Si_wH_xN_yC_zBr$, through ion implantation and surface reactions, which may react with the fluorine-based reactive gas to form volatile materials, such as $SiF_4$, one or more of $CH_4$, CN, $CF_4$, $CCl_4$, $CBr_4$, and the like. As another example, uncovered areas of a $TiO_x$ layer (e.g., a $TiO_2$ layer) may be converted to $Ti_wH_xN_zF$, $Ti_wH_xN_zCl$, or $Ti_wH_xN_zBr$ through ion implantation and surface reactions, which may react with the fluorine-based reactive gas to form volatile materials, such as $TiF_4$, one or more of $O_2$, $CO_2$, and $H_2O$, and the like. The volatile materials may be relatively easily removed from the etched area, and thus would not form residues in the etched area that may prevent or hinder further etching of the underlying materials.

Figure 17A:
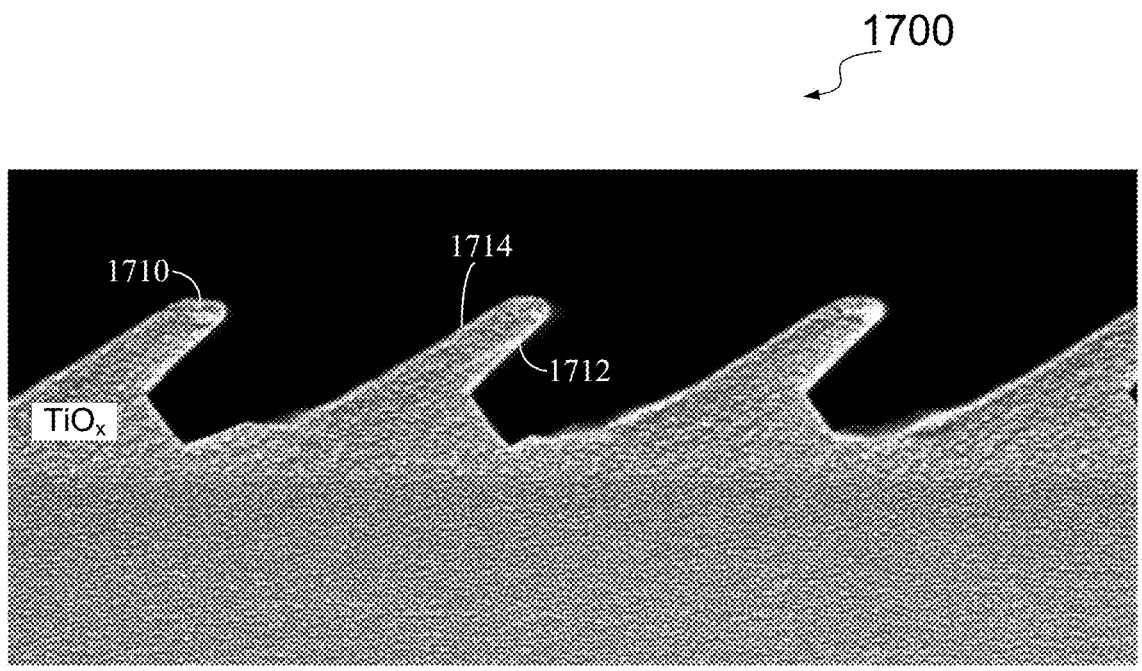
FIG. 17A illustrates an example slanted grating fabricated on an ultra-high-index material layer using a CARIBE process according to certain embodiments.

FIG. 17A illustrates an example of a slanted grating 1700 fabricated using a CARIBE process that utilizes an ion beam containing hydrogen and nitrogen ions according to certain embodiments. Slanted grating 1700 may be fabricated in a $TiO_x$ layer using any appropriate mask described herein. As shown in FIG. 17A, the slant angle of a leading edge 1712 of a ridge 1710 of slanted grating 1700 may be similar to the slant angle of a trailing edge 1714 of ridge 1710 of slanted grating 1700. In the example shown in FIG. 17A, the slant angles of leading edge 1712 and/or trailing edge 1714 may be about 45 degrees. The difference between the slant angle of leading edge 1712 and the slant angle of trailing edge 1714 may be less than 10 degrees, less than 5 degrees, less than 4 degrees, less than 3 degrees, less than 2 degrees, less than 1 degree, or less. As also shown in FIG. 17A, the difference between the length of leading edge 1712 and the length of trailing edge 1714 is significantly less than the difference between the length of leading edge 1612 and the length of trailing edge 1614 shown in FIG. 16B. A much greater depth is also achieved in slanted grating 1700 than in slanted grating 1600.

Figure 17B:
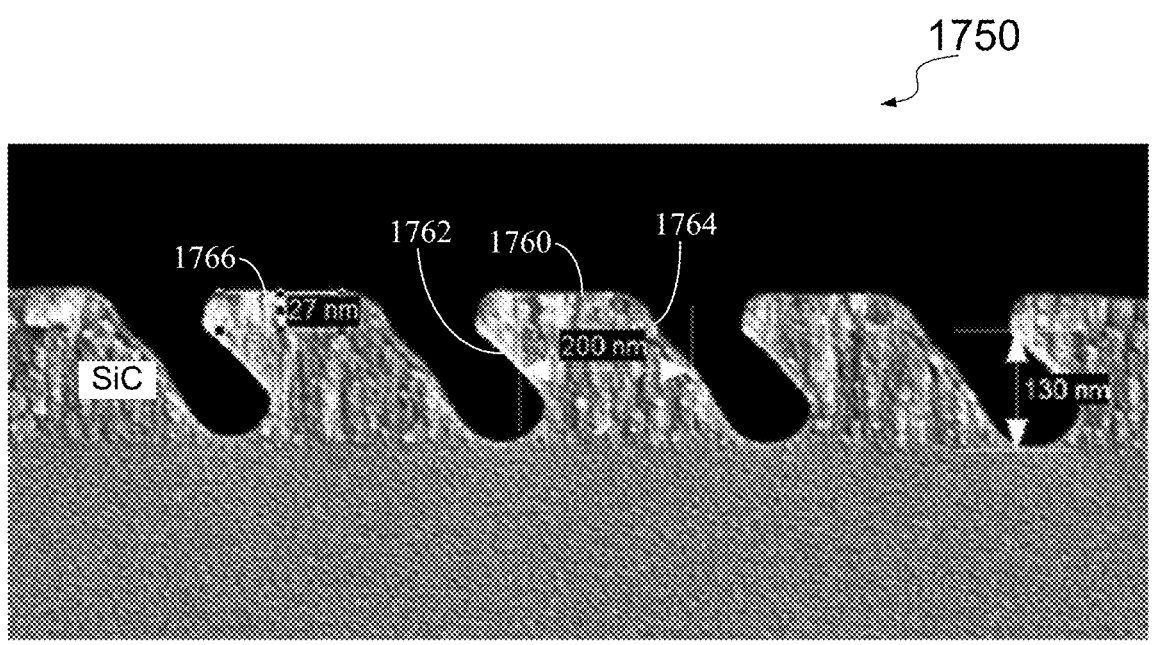
FIG. 17B illustrates a further example slanted grating fabricated on an ultra-high-index material layer using a CARIBE process according to certain embodiments.

FIG. 17B illustrates another example of a slanted grating 1750 fabricated using a CARIBE process utilizing an ion beam containing hydrogen and nitrogen ions according to certain embodiments. Slanted grating 1750 may be fabricated on a SiC layer using an appropriate mask described herein. As shown in FIG. 17B, the slant angle of a leading edge 1762 of a ridge 1760 of slanted grating 1750 may be similar to the slant angle of a trailing edge 1764 of ridge 1760 of slanted grating 1750. The difference between the slant angle of leading edge 1762 and the slant angle of trailing edge 1764 may be less than 10 degrees, less than 5 degrees, less than 4 degrees, less than 3 degrees, less than 2 degrees, less than 1 degree, or less. As also shown in FIG. 17B, the difference between the length of leading edge 1762 and the length of trailing edge 1764 is significantly less than the difference between the length of leading edge 1662 and the length of trailing edge 1664 shown in FIG. 16B. The depths of grating grooves in slanted grating 1750 may be much greater than those in slanted grating 1650. In the example shown in FIG. 17B, the width of ridge 1760 may be about 200 nm, and the duty cycle of slanted grating 1750 may be greater than about 60%. The bottom of the grating grooves may also be relatively flat compared with slanted grating 1650. The depth of ridge 1760 may be about 130 nm, and a mask layer 1766 on may have a thickness 27 nm. Thus, a narrow and deep slanted groove with the leading edge substantially parallel to the trailing edge may be fabricated using the process disclosed herein.

FIGS. 17A and 17B show that the CARIBE techniques disclosed herein, such as concurrent hydrogen and nitrogen doping, can be used to fabricate slanted structures with symmetric profiles and target depths in ultra-high-index materials that may have refractive indices about 2.3 or greater. The CARIBE techniques disclosed herein can be used to reliably fabricated a slanted structure with a leading edge and a trailing edge parallel or substantially parallel to each other (e.g., with a slant angle difference less than about 1, 2, 3, 5, or 10 degrees). The symmetric profile, high depth, and the large refractive index modulation of the etched slanted grating may lead to an improved performance of an input or output coupler of a waveguide display. Furthermore, the CARIBE techniques disclosed herein can be used to more efficiently and accurately fabricate deep and narrow surface-relief structures, while maintaining the parallel relationship between the leading edge and the trailing edge.

Figure 18:
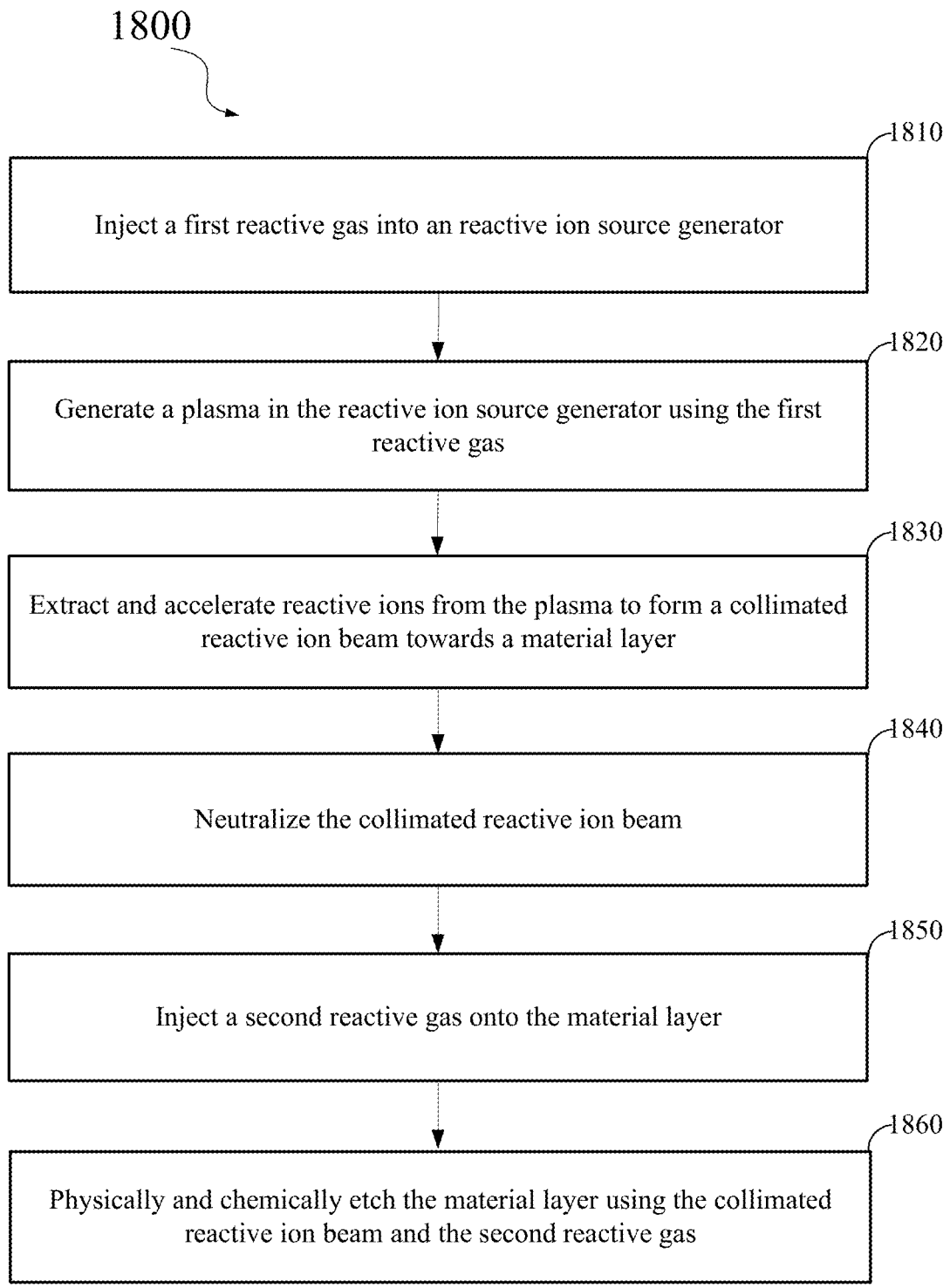
FIG. 18 is a simplified flow chart illustrating an example method of fabricating a slanted surface-relief structure according to certain embodiments.

FIG. 18 is a simplified flow chart 1800 illustrating an example of a method of fabricating a slanted surface-relief structure according to certain embodiments. The slanted surface-relief structure may be fabricated in an ultra-high-index material that may have a refractive index about 2.3 or greater (e.g., $TiO_x$, $LiNbO_3$, $HfO_x$, $TiSiO_x$, SiC, ZnSe, InGaAs, GaP, etc.). The operations described in flow chart 1800 are for illustration purposes only and are not intended to be limiting. In various implementations, modifications may be made to flow chart 1800 to add additional operations or to omit some operations. The operations described in flow chart 1800 may be performed using, for example, CARIBE system 1400 described above.

At block 1810, a first reactive gas may be injected into a chamber of an ion source generator, such as ion source generator 1410 shown in FIG. 14. The first reactive gas may include one or more of, for example, $H_2$, $N_2$, $NF_3$, $NH_3$, $CH_4$, $CHF_3$, $Cl_2$, $BCl_3$, HBr, and the like, such that hydrogen ions and nitrogen ions may be generated by the ion source generator. In some embodiments, to minimize or eliminate carbon deposition in the fabricated grating, the first reactive gas may not include carbon. For example, the first reactive gas may include one or more of $H_2$, $N_2$, $NF_3$, $NH_3$, and the like.

In some embodiments, the first reactive gas may be a single gas that may include both hydrogen and nitrogen. In some embodiments, the first reactive gas may include multiple (e.g., two or more) gas species, with one or more gas species including at least hydrogen and one or more gas species including at least nitrogen. The multiple gas species may be injected into the chamber of the ion source generator concurrently or successively. For example, in some embodiments, the first reactive gas may include a hydrogen-based reactive gas and a nitrogen-based reactive gas. In some embodiments, the hydrogen-based reactive gas may be first injected into the chamber of the ion source generator, and then the nitrogen-based reactive gas may be injected into the chamber of the ion source generator, or vice versa. In some embodiments, the hydrogen-based reactive gas and the nitrogen-based reactive gas may be injected into the chamber of the ion source generator concurrently, which may improve production throughput. In some embodiments, an inert gas, such as Argon, He, or Ne, may also be injected into the reactive ion source generator.

At block 1820, the ion source generator may generate a high density plasma in the chamber of the ion source generator. For example, a time-varying electric current (e.g., an RF current signal) may be passed through a coil that may create a time-varying magnetic field around it. The time-varying magnetic field may in turn induce an electric field in the chamber of the ion source generator and lead to the discharge of electrons. The discharged electrons may impact the gas in the chamber of the ion source generator to generate reactive ions (e.g., hydrogen ions and nitrogen ions). Thus, the chamber of the ion source generator may include neutrals, ions, and electrons.

At block 1830, the reactive ions including hydrogen ions and nitrogen ions may be extracted from the high density plasma and may be accelerated to form a collimated reactive ion beam towards a material layer to be etched. As described above, for example, one or more aligned collimator grids may be used to extract and accelerate the reactive ions to form a highly directive, highly energetic collimated reactive ion beam. In some embodiments, the one or more aligned collimator grids may include an extraction grid that may be in contact with the high density plasma and control its potential, and an acceleration grid that may be driven by an adjustable negative high voltage supply for accelerating the ions.

Optionally, at block 1840, the collimated reactive ion beam extracted from the ion source generator by the aligned collimator grids may be neutralized by an electron beam to form a collimated beam that may include neutrals and/or ions and electrons that are approximately in charge equilibrium. Therefore, the collimated beam may be electronically neutral, thus preventing the buildup of positive charges on the material layer to be etched.

At block 1850, a second reactive gas may be injected onto the material layer to be etched. The second reactive gas may include a fluorine-based reactive gas or chlorine-based reactive gas. The fluorine-based reactive gas may include, for example, $CF_4$, $NF_3$, $SF_6$, and the like. The chlorine-based reactive gas may include, for example, $Cl_2$ or $BCl_3$ and the like. The bromine-based reactive gas may include, for example HBr and the like. The second reactive gas may be injected at a location closed to the material layer to be etched. For example, the second reactive gas may be injected onto the material layer using a gas ring as described above. In some embodiments, the second reactive gas may be added to the ion source generator, along with the first reactive gas.

At block 1860, the collimated beam and the second reactive gas may both physically mill and chemically etch the material layer as described above. As mentioned above, the material layer to be etched may include a material layer having an ultra-high refractive index (e.g., greater than or about 2.3), such as $TiO_x$, $LiNbO_3$, $HfO_x$. $TiSiO_x$, SiC, ZnSe, InGaAs, GaP, and the like. As also described above, the material layer to be etched may be mounted on a rotation stage that may be tilted based on the desired slant angle of the slanted structure to be etched on the material layer and may rotate with respect to the direction of the collimated beam. The material layer may be partially covered by a patterned mask including a pattern similar to the desired pattern of a cross-section of the slanted structure. In some embodiments, a shutter or blade may be used to control the etch time and/or etch region on the material layer.

In some embodiments, the slanted structure may include a slanted grating. The slant angles of the leading edge and the trailing edge of the slanted grating fabricated using the method described in flow chart 1800 may be greater than about 30 degrees, greater than about 35 degrees, greater than about 40 degrees, greater than about 45 degrees, greater than about 50 degrees, greater than about 55 degrees, or greater than about 60 degrees with respect to a surface normal of the material layer. A difference between the length of the leading edge and the length of the trailing edge may be less than about 30%, less than about 25%, less than about 20%, less than about 15%, less than about 10%, or less than about 5% of the length of the trailing edge. The depth of the slanted grating fabricated using the method described in flow chart 1800 may be greater than about 100 nm, greater than about 125 nm, greater than about 150 nm, greater than about 175 nm, or greater than about 200 nm. The duty cycle of the slanted grating may be less than about 20%, less than about 30%, less than about 40%, less than about 50%, greater than about 50%, greater than about 60%, greater than about 70%, greater than about 80%, or greater than about 90%. Thus, by doping the ultra-high-index material layer with hydrogen ions and nitrogen ions through ion implantation and/or surface reaction, a slanted grating with large depth, large slant angle, high duty cycle range, symmetric ridge profile, and the like, may be accurately and efficiently fabricated.

Without intending to be bound to any particular theory, given its relatively large mass, nitrogen ions can be very effective in penetrating into the ultra-high-index materials and disrupting or breaking the strong chemical bonds of the ultra-high-index materials. Hydrogen ions, given its relatively small size, can pass through gaps between atoms and penetrate further deep into the ultra-high-index materials, disrupting the crystal structure of the ultra-high-index materials and weakening and/or breaking some chemical bonds of the ultra-high-index materials. When hydrogen ions and nitrogen ions are generated and flow towards the ultra-high-index materials concurrently to dope and/or modify the ultra-high-index materials, the modified ultra-high-index materials may react with the reactive gas and thus may be etched more efficiently and more accurately. The etch rate of the ultra-high-index materials may be significantly improved over existing technologies, and a much deeper grating may be etched without causing excessive or significant damage to the leading edges and/or the trailing edges of the ridges of the grating. Consequently, a slanted grating with much greater grating depths and more symmetrical structures (e.g., substantially similar slant angles between the leading edge and the trailing edge) may be achieved.

Additionally, because nitrogen is a polarized species, nitrogen ions can also be more effective in reacting with the ultra-high-index materials to form easy-to-etch materials (e.g., breaking the Si—C bond in SiC) that may react with some reactive gases (e.g., a fluorine-based reactive gas) to generate volatile byproducts, which can reduce or eliminate byproduct accumulation at the bottom of the grooves of the grating (such as carbon deposition when etching is performed using carbon-based reactive gas species). Nitrogen may not react with the ultra-high-index materials to form non-volatile materials. In contrast, in some existing techniques, other polarized species, such as oxygen, may be utilized, but oxygen may react with silicon to form silicon oxide, which may be difficult to remove. As such, in some embodiments, the first reactive gas may not include, or free of, oxygen or carbon.

In some embodiments, during the etching process, the operation of doping with hydrogen ions and nitrogen ions and the operation of etching using the fluorine-based reactive gas species may be performed concurrently. In other words, the collimated reactive ion beam containing hydrogen ions and nitrogen ions and the fluorine-based reactive gas species may flow towards the ultra-high-index materials concurrently to dope, modify, and etch the ultra-high-index material concurrently.

In some embodiments, the etching process may include multiple operations. For example, in some embodiments, the hydrogen ions and the nitrogen ions may first be generated and used to dope, modify, and/or etch the ultra-high-index materials. In some embodiments, the doping of the ultra-high-index materials with hydrogen and nitrogen may be carried out concurrently or sequentially. In some embodiments, the ultra-high-index materials may be first doped, modified, and/or etched with nitrogen ions and then doped, modified, and/or etched with hydrogen ions, or vice versa. After the ultra-high-index material is doped, modified, and/or etched with the hydrogen ions and hydrogen ions, in a separate operation, other reactive gases, such as fluorine-based reactive gas species, may be used to chemically etch the doped ultra-high-index materials.

In some embodiments, the operation of doping and/or etching with hydrogen ions and nitrogen ions and the operation of etching using the fluorine-based reactive gas species may be performed in each cycle of a plurality of cycles to etch the slanted gratings. When the operation of doping with hydrogen ions and nitrogen ions and the operation of etching using the fluorine-based reactive gas species are performed concurrently, the etching process may be performed in one continuous cycle.

In some embodiments, the slanted grating fabricated using the method described in flow chart 1800 may be over-coated with a material having a refractive index different from the grating material layer. For example, in some embodiments, a high refractive index material, such as Hafnia, Titania, Tungsten oxide, Zirconium oxide, Gallium sulfide, Gallium nitride, Gallium phosphide, silicon, or a high refractive index polymer, may be used to over-coat the slanted grating and/or fill the gaps between the ridges of the slanted grating. In some embodiments, a low refractive index material, such as silicon oxide, alumina, porous silica, or fluorinated low index monomer (or polymer), may be used to over-coat the slanted grating and/or fill the gaps between the ridges of the slanted grating. As a result, the difference between the refractive index of the ridges and the refractive index of the grooves of the slanted grating may be greater than 0.1, 0.2, 0.3, 0.5, 1.0, or higher.

In some embodiments, hydrogen and nitrogen may be present in the slanted grating fabricated using the method described in flow chart 1800. Because the ion beam containing the hydrogen ions and nitrogen ions may be highly collimated and highly directional, the presence of nitrogen and/or hydrogen atoms may be limited to the bottom region of the slanted grating (e.g., below the bottom of the grooves of the grating), while the ridges of the grating may include substantially no or very limited amount of hydrogen and/or nitrogen (except the hydrogen and/or nitrogen that may be inherently present in the material forming the grating). In some embodiments, the concentration of hydrogen near the bottom of the grooves of the slanted grating may be $10^{10}/cm^3$ or higher. In some embodiments, the concentration of nitrogen near the bottom of the grooves of the slanted grating may be $10^{10}/cm^3$ or higher. In some embodiments, a combined concentration of hydrogen and/or nitrogen near the bottom of the grooves of the slanted grating may be $10^{10}/cm^3$ or higher.

Embodiments of the invention may include or be implemented in conjunction with an artificial reality system. Artificial reality is a form of reality that has been adjusted in some manner before presentation to a user, which may include, for example, a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Figure 19:
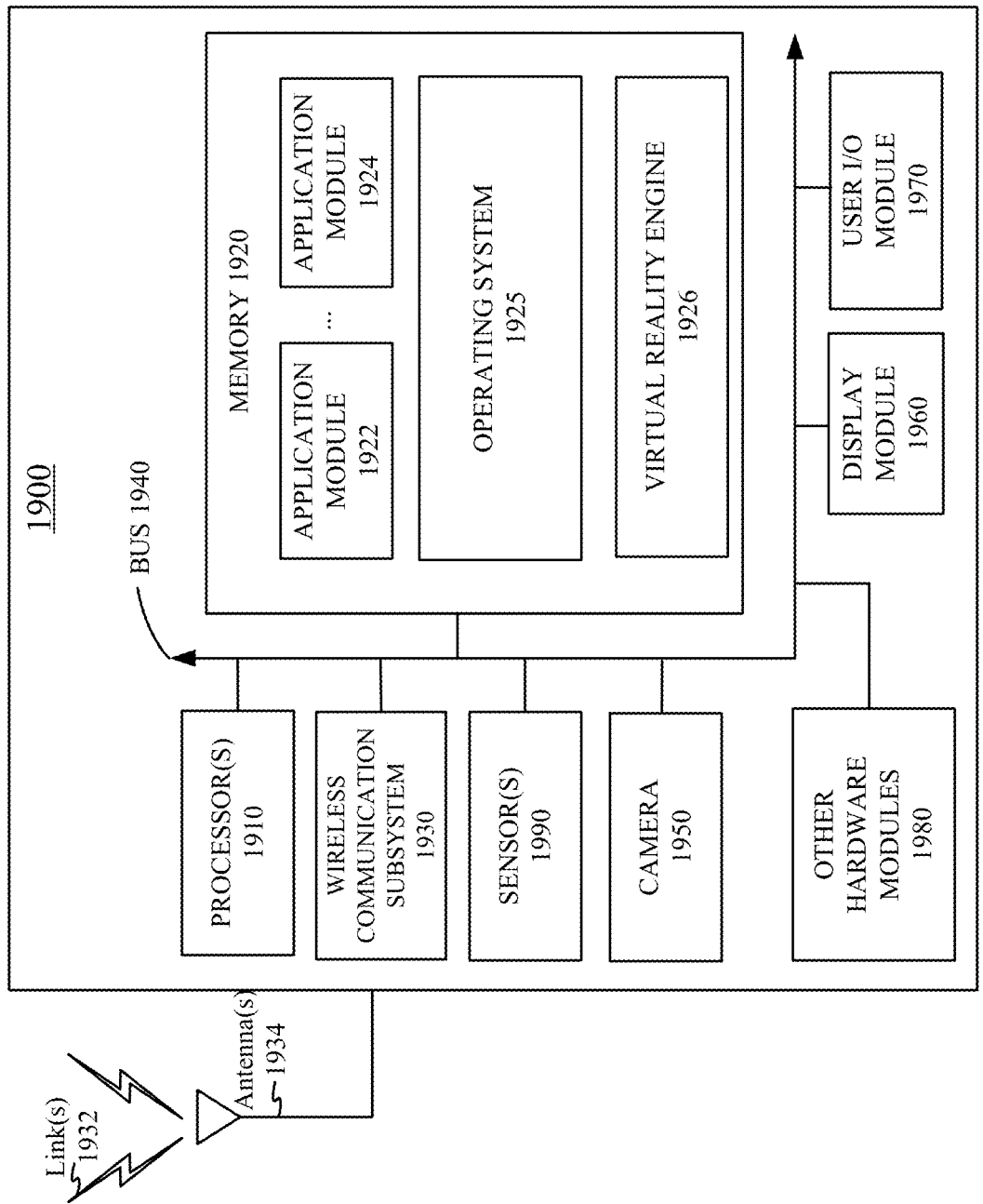
FIG. 19 is a simplified block diagram of an example electronic system of an example near-eye display for implementing some of the examples disclosed herein.

FIG. 19 is a simplified block diagram of an example electronic system 1900 of an example near-eye display (e.g., HMD device) for implementing some of the examples disclosed herein. Electronic system 1900 may be used as the electronic system of an HMD device or other near-eye displays described above. In this example, electronic system 1900 may include one or more processor(s) 1910 and a memory 1920. Processor(s) 1910 may be configured to execute instructions for performing operations at a number of components, and can be, for example, a general-purpose processor or microprocessor suitable for implementation within a portable electronic device. Processor(s) 1910 may be communicatively coupled with a plurality of components within electronic system 1900. To realize this communicative coupling, processor(s) 1910 may communicate with the other illustrated components across a bus 1940. Bus 1940 may be any subsystem adapted to transfer data within electronic system 1900. Bus 1940 may include a plurality of computer buses and additional circuitry to transfer data.

Memory 1920 may be coupled to processor(s) 1910. In some embodiments, memory 1920 may offer both short-term and long-term storage and may be divided into several units. Memory 1920 may be volatile, such as static random access memory (SRAM) and/or dynamic random access memory (DRAM) and/or non-volatile, such as read-only memory (ROM), flash memory, and the like. Furthermore, memory 1920 may include removable storage devices, such as secure digital (SD) cards. Memory 1920 may provide storage of computer-readable instructions, data structures, program modules, and other data for electronic system 1900. In some embodiments, memory 1920 may be distributed into different hardware modules. A set of instructions and/or code might be stored on memory 1920. The instructions might take the form of executable code that may be executable by electronic system 1900, and/or might take the form of source and/or installable code, which, upon compilation and/or installation on electronic system 1900 (e.g., using any of a variety of generally available compilers, installation programs, compression/decompression utilities, etc.), may take the form of executable code.

In some embodiments, memory 1920 may store a plurality of application modules 1922 through 1924, which may include any number of applications. Examples of applications may include gaming applications, conferencing applications, video playback applications, or other suitable applications. The applications may include a depth sensing function or eye tracking function. Application modules 1922-1924 may include particular instructions to be executed by processor(s) 1910. In some embodiments, certain applications or parts of application modules 1922-1924 may be executable by other hardware modules 1980. In certain embodiments, memory 1920 may additionally include secure memory, which may include additional security controls to prevent copying or other unauthorized access to secure information.

In some embodiments, memory 1920 may include an operating system 1925 loaded therein. Operating system 1925 may be operable to initiate the execution of the instructions provided by application modules 1922-1924 and/or manage other hardware modules 1980 as well as interfaces with a wireless communication subsystem 1930 which may include one or more wireless transceivers. Operating system 1925 may be adapted to perform other operations across the components of electronic system 1900 including threading, resource management, data storage control and other similar functionality.

Wireless communication subsystem 1930 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 1900 may include one or more antennas 1934 for wireless communication as part of wireless communication subsystem 1930 or as a separate component coupled to any portion of the system. Depending on desired functionality, wireless communication subsystem 1930 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 1930 may permit data to be exchanged with a network, other computer systems, and/or any other devices described herein. Wireless communication subsystem 1930 may include a means for transmitting or receiving data, such as identifiers of HMD devices, position data, a geographic map, a heat map, photos, or videos, using antenna(s) 1934 and wireless link(s) 1932. Wireless communication subsystem 1930, processor(s) 1910, and memory 1920 may together comprise at least a part of one or more of a means for performing some functions disclosed herein.

Embodiments of electronic system 1900 may also include one or more sensors 1990. Sensor(s) 1990 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 1990 may include one or more inertial measurement units (EMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or some combination thereof. The position sensors may be located external to the IMU, internal to the IMU, or some combination thereof. At least some sensors may use a structured light pattern for sensing.

Electronic system 1900 may include a display module 1960. Display module 1960 may be a near-eye display, and may graphically present information, such as images, videos, and various instructions, from electronic system 1900 to a user. Such information may be derived from one or more application modules 1922-1924, virtual reality engine 1926, one or more other hardware modules 1980, a combination thereof, or any other suitable means for resolving graphical content for the user (e.g., by operating system 1925). Display module 1960 may use liquid crystal display (LCD) technology, light-emitting diode (LED) technology (including, for example, OLED, ILED, mLED, AMOLED, TOLED, etc.), light emitting polymer display (LPD) technology, or some other display technology.

Electronic system 1900 may include a user input/output module 1970. User input/output module 1970 may allow a user to send action requests to electronic system 1900. An action request may be a request to perform a particular action. For example, an action request may be to start or end an application or to perform a particular action within the application. User input/output module 1970 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 1900. In some embodiments, user input/output module 1970 may provide haptic feedback to the user in accordance with instructions received from electronic system 1900. For example, the haptic feedback may be provided when an action request is received or has been performed.

Electronic system 1900 may include a camera 1950 that may be used to take photos or videos of a user, for example, for tracking the user's eye position. Camera 1950 may also be used to take photos or videos of the environment, for example, for VR, AR, or MR applications. Camera 1950 may include, for example, a complementary metal-oxide-semiconductor (CMOS) image sensor with a few millions or tens of millions of pixels. In some implementations, camera 1950 may include two or more cameras that may be used to capture 3-D images.

In some embodiments, electronic system 1900 may include a plurality of other hardware modules 1980. Each of other hardware modules 1980 may be a physical module within electronic system 1900. While each of other hardware modules 1980 may be permanently configured as a structure, some of other hardware modules 1980 may be temporarily configured to perform specific functions or temporarily activated. Examples of other hardware modules 1980 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 1980 may be implemented in software.

In some embodiments, memory 1920 of electronic system 1900 may also store a virtual reality engine 1926. Virtual reality engine 1926 may execute applications within electronic system 1900 and receive position information, acceleration information, velocity information, predicted future positions, or some combination thereof of the HMD device from the various sensors. In some embodiments, the information received by virtual reality engine 1926 may be used for producing a signal (e.g., display instructions) to display module 1960. For example, if the received information indicates that the user has looked to the left, virtual reality engine 1926 may generate content for the HMD device that mirrors the user's movement in a virtual environment. Additionally, virtual reality engine 1926 may perform an action within an application in response to an action request received from user input/output module 1970 and provide feedback to the user. The provided feedback may be visual, audible, or haptic feedback. In some implementations, processor(s) 1910 may include one or more GPUs that may execute virtual reality engine 1926.

In various implementations, the above-described hardware and modules may be implemented on a single device or on multiple devices that can communicate with one another using wired or wireless connections. For example, in some implementations, some components or modules, such as GPUs, virtual reality engine 1926, and applications (e.g., tracking application), may be implemented on a console separate from the head-mounted display device. In some implementations, one console may be connected to or support more than one HMD.

In alternative configurations, different and/or additional components may be included in electronic system 1900. Similarly, functionality of one or more of the components can be distributed among the components in a manner different from the manner described above. For example, in some embodiments, electronic system 1900 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A method of fabricating a slanted surface-relief structure in a material layer, the method comprising:
    injecting a first reactive gas into a reactive ion source generator;
    generating a plasma from the first reactive gas in the reactive ion source generator, the plasma including first reactive ions having a first atomic weight and second reactive ions having a second atomic weight less than the first atomic weight;
    extracting at least some of the first reactive ions and at least some of the second reactive ions from the plasma to form a collimated reactive ion beam towards the material layer that has a refractive index at least 2.3;
    injecting a second reactive gas onto the material layer; and
    etching the material layer both physically and chemically with the collimated reactive ion beam and the second reactive gas to form the slanted surface-relief structure in the material layer.

2. The method of claim 1, wherein the material layer comprises at least one of $TiO_x$, $LiNbO_3$, $HfO_x$, $TiSiO_x$, SiC, ZnSe, InGaAs, or GaP.

3. The method of claim 1, wherein the first reactive ions comprise nitrogen ions.

4. The method of claim 1, wherein the second reactive ions comprise hydrogen ions.

5. The method of claim 1, wherein the first reactive gas comprises at least one of $H_2$, $N_2$, $NF_3$, $NH_3$, $CH_4$, $CHF_3$, $Cl_2$, $BCl_3$, or HBr.

6. The method of claim 1, wherein the first reactive gas is free of oxygen or carbon.

7. The method of claim 1, wherein the second reactive gas comprises a fluorine-based reactive gas.

8. The method of claim 7, wherein the second reactive gas comprises at least one of $CF_4$, $NF_3$, $SF_6$, $Cl_2$, $BCl_3$, or HBr.

9. The method of claim 1, wherein extracting at least some of the first reactive ions and at least some of the second reactive ions from the plasma to form the collimated reactive ion beam comprises:
    applying an extraction voltage on an extraction grid adjacent to the reactive ion source generator; and
    applying an acceleration voltage on an acceleration grid to extract and accelerate at least some of the first reactive ions and at least some of the second reactive ions;
    wherein the extraction grid and the acceleration grid are aligned; and
    wherein the acceleration voltage is different from the extraction voltage.

10. The method of claim 1, wherein:
    the slanted surface-relief structure comprises a slanted surface-relief optical grating; and
    the slanted surface-relief optical grating comprises a plurality of ridges.

11. The method of claim 10, wherein a leading edge of each ridge of the plurality of ridges is parallel to a trailing edge of the ridge.

12. The method of claim 10, wherein the slanted surface-relief optical grating is characterized by at least one of:
    a slant angle of a leading edge of each ridge of the plurality of ridges and a slant angle of a trailing edge of the ridge greater than 30 degrees with respect to a surface normal of the material layer;
    a difference between a length of the leading edge and a length of the trailing edge less than 10% of the length of the trailing edge;
    a depth of the slanted surface-relief optical grating greater than 100 nm; or
    a duty cycle of the slanted surface-relief optical grating greater than 60%.

13. A method of fabricating a slanted surface-relief structure in a material layer, the method comprising:
    injecting a first reactive gas into an reactive ion source generator, wherein the first reactive gas comprises hydrogen and nitrogen;
    generating a plasma from the first reactive gas in the reactive ion source generator, the plasma including nitrogen ions and hydrogen ions;

extracting at least some of the nitrogen ions and at least some of the hydrogen ions from the reactive ion source generator to form a collimated reactive ion beam towards the material layer;

injecting a second reactive gas onto the material layer, wherein the second reactive gas comprises fluorine; and etching the material layer both physically and chemically with the collimated reactive ion beam and the second reactive gas to form the slanted surface-relief structure, wherein the material layer comprises at least one of $TiO_x$, $LiNbO_3$, $HfO_x$, $TiSiO_x$, SiC, ZnSe, InGaAs, or GaP.

14. The method of claim 13, wherein:
the material layer includes a $TiO_x$ layer; and
at least some of the hydrogen ions and at least some of the nitrogen ions react with the $TiO_x$ layer to form a $Ti_wH_xN_zF$, $Ti_wH_xN_zCl$, or $Ti_wH_xN_zBr$ layer.

15. The method of claim 14, wherein the second reactive gas reacts with the $Ti_wH_xN_zF$, $Ti_wH_xN_zCl$, or $Ti_wH_xN_zBr$ layer to generate at least one of $TiF_4$, $TiCl_4$, or $TiBr_4$, and at least one of $O_2$, $CO_2$, $H_2O$, or $B_2O_3$.

16. The method of claim 13, wherein:
the material layer includes a SiC layer; and
at least some of the hydrogen ions and at least some of the nitrogen ions react with the SiC layer to form a $Si_wH_xN_yC_zF$, $Si_wH_xN_yC_zCl$, or $Si_wH_xN_yC_zBr$ layer.

17. The method of claim 16, wherein the second reactive gas reacts with the $Si_wH_xN_yC_zF$, $Si_wH_xN_yC_zCl$, or $Si_wH_xN_yC_zBr$ layer to generate $SiF_4$, $SiCl_4$, or $SiBr_4$, and at least one of $CH_4$, CN, $CF_4$, $CCl_4$, or $CBr_4$.

18. A surface-relief structure comprising:
a substrate,
a plurality of ridges on the substrate, wherein:
the plurality of ridges are slanted with respect to the substrate; and
the plurality of ridges comprises a material having a refractive index at least 2.3; and
a plurality of grooves each between two adjacent ridges, wherein:
regions of the substrate at bottoms of the plurality of grooves comprise at least one of hydrogen or nitrogen at a concentration of at least $10^{10}/cm^3$.

19. The surface-relief structure of claim 18, wherein the material of the plurality of ridges comprises at least one of $TiO_x$, $LiNbO_3$, $HfO_x$, $TiSiO_x$, SiC, ZnSe, InGaAs, or GaP.

20. The surface-relief structure of claim 18, wherein the surface-relief structure is characterized by at least one of:
a leading edge of each ridge of the plurality of ridges parallel to a trailing edge of the ridge;
a slant angle of the leading edge and a slant angle of the trailing edge greater than degrees with respect to a surface normal of the substrate;
a difference between a length of the leading edge and a length of the trailing edge less than 10% of the length of the trailing edge;
a depth of the plurality of grooves greater than 100 nm; or
a duty cycle of the surface-relief structure greater than 60%.

* * * * *